(12) United States Patent
Ezaki et al.

(10) Patent No.: US 7,209,380 B2
(45) Date of Patent: Apr. 24, 2007

(54) MAGNETIC MEMORY DEVICE AND METHOD OF READING THE SAME

(75) Inventors: Joichiro Ezaki, Chuo-ku (JP); Yuji Kakinuma, Chuo-ku (JP); Keiji Koga, Chuo-ku (JP); Shigekazu Sumita, Chuo-ku (JP)

(73) Assignee: TDK Corporation, Tokyo (JP)

( * ) Notice: Subject to any disclaimer, the term of this patent is extended or adjusted under 35 U.S.C. 154(b) by 13 days.

(21) Appl. No.: 10/547,508

(22) PCT Filed: Mar. 12, 2004

(86) PCT No.: PCT/JP2004/003362

§ 371 (c)(1),
(2), (4) Date: Aug. 31, 2005

(87) PCT Pub. No.: WO2004/081943

PCT Pub. Date: Sep. 23, 2004

(65) Prior Publication Data

US 2006/0120145 A1    Jun. 8, 2006

(30) Foreign Application Priority Data

Mar. 13, 2003    (JP) .............................. 2003-068820

(51) Int. Cl.
*G11C 11/00* (2006.01)
(52) U.S. Cl. ...................................... 365/158; 365/171
(58) Field of Classification Search ................ 365/158, 365/171
See application file for complete search history.

(56) References Cited

U.S. PATENT DOCUMENTS 5,343,422 A    8/1994  Kung et al.
5,629,922 A    5/1997  Moodera et al.

(Continued)

FOREIGN PATENT DOCUMENTS

| EP | 1 109 170 A2 | 12/2000 |
|---|---|---|
| EP | 1 406 266 A2 | 4/2004 |
| JP | A 9-91949 | 4/1997 |

(Continued)

OTHER PUBLICATIONS

Scheuerlein et al., "A 10ns Read and Write Non-Volatile Memory Array Using a Magnetic Tunnel Junction and FET Switch in each Cell", ISSCC 2000/Session 7/TD: Emerging Memory & Device Technologies/Paper TA 7.2, Digest of Technical Papers, pp. 128-129.

*Primary Examiner*—Michael Tran
(74) *Attorney, Agent, or Firm*—Oliff and Berridge, PLC

(57) ABSTRACT

The present invention provides a magnetic memory device capable of performing reading operation with lower power consumption and at high read precision and a method of reading the magnetic memory device. Sense bit lines (21A, 21B) are provided in a bit line direction for each pair of magnetoresistive devices (12A, 12B) constructing a storage cell (12) and a read current is supplied. The read currents passed through the pair of magnetoresistive devices (12A, 12B) flow to the ground via a sense word line (31). Further, by providing a constant current circuit (108B) commonly for plural sense word lines (31), the sum of a pair of read currents passing through the pair of magnetoresistive devices (12A, 12B) in one storage cell constant, and information is read from the storage cell (12) on the basis of the difference between the pair of read currents. By sharing the constant current circuit (108B), variations in the sum of the pair of read currents can be reduced, and power consumption can be also reduced.

16 Claims, 27 Drawing Sheets

U.S. PATENT DOCUMENTS

| | | |
|---|---|---|
| 6,191,989 B1 | 2/2001 | Luk et al. |
| 2002/0006058 A1 | 1/2002 | Nakajima et al. |
| 2002/0054500 A1 | 5/2002 | Yamada |
| 2002/0140000 A1 | 10/2002 | Watanabe |
| 2002/0186582 A1 | 12/2002 | Sharma et al. |
| 2004/0001351 A1* | 1/2004 | Subramanian et al. ...... 365/158 |
| 2005/0146926 A1* | 7/2005 | Inaba ......................... 365/171 |
| 2006/0215443 A1* | 9/2006 | Katti .......................... 365/158 |

FOREIGN PATENT DOCUMENTS

| | | |
|---|---|---|
| JP | A 2001-236781 | 8/2001 |
| JP | A 2001-266567 | 9/2001 |
| JP | A 2001-273759 | 10/2001 |
| JP | A 2002-170374 | 6/2002 |
| JP | A 2002-353415 | 12/2002 |

* cited by examiner

「0」

「1」

MAGNETIC MEMORY DEVICE AND METHOD OF READING THE SAME

BACKGROUND OF THE INVENTION

1. Field of the Invention

The present invention relates to a magnetic memory device having a magnetoresistive device and a method of reading the same.

2. Background Art

Conventionally, as general memories used for an information processor such as a computer or a mobile communication device, volatile memories such as a DRAM (Dynamic Random Access Memory) and an SRAM (Static RAM) are used. If current is not always supplied to the volatile memories, all of information in the volatile memories is lost. Consequently, means for storing information, that is, a nonvolatile memory has to be provided, and a flash EEPROM, a hard disk device, or the like is used. In the nonvolatile memories, as the speed of information processing increases, increase in access speed is an important subject. Further, as a portable information device is being rapidly spread and its performance is becoming higher, development of an information device aiming at so-called ubiquitous computing such that information processing can be performed everywhere at any time is rapidly being progressed. Development of a higher-speed nonvolatile memory as a key device in development of such a device is in strong demand.

As a technique effective to increase the speed of the nonvolatile memory, an MRAM (magnetic random access memory) is known. In the MRAM, each of storage cells arranged in a matrix is constructed by a magnetic device having two ferromagnetic layers. In each of the storage cells, by making the magnetization directions of the ferromagnetic layers of the device parallel or anti-parallel with the axis of easy magnetization in correspondence with binary information of "0" or "1", information is stored. The resistance value in a specific direction of the magnetic device varies according to whether the magnetization direction of the ferromagnetic layer is parallel or anti-parallel. Therefore, by detecting the resistance which varies according to information as a change in current or voltage, information is read from a storage cell. Since the MRAM operates on the basis of such a principle, it is important that the resistance change ratio is as high as possible to perform stable writing and reading in the MRAM.

The MRAM currently used in practice utilizes the giant magneto-resistive (GMR) effect. The GMR effect is a phenomenon such that when two magnetic layers are disposed so that their axes of easy magnetization are parallel with each other, in the case where the magnetization directions of the layers are parallel with the axis of easy magnetization, the resistance value becomes the minimum and in the case where the magnetization directions are anti-parallel with the axis of easy magnetization, the resistance value becomes the maximum. An MRAM using a GMR device (hereinafter, described as GMR-MRAM) is disclosed in, for example, U.S. Pat. No. 5,343,422.

The GMR-MRAM has a coercive force difference type (pseudo spin valve type) and an exchange bias type (spin valve type). In the MRAM of the pseudo spin valve type, the GRM device is constructed by stacking two ferromagnetic layers and a nonmagnetic layer sandwiched between the two ferromagnetic layers and, by using the difference between the coercive forces of the two ferromagnetic layers, information is written/read. In the MRAM of the spin valve type, two ferromagnetic layers are constructed by a pinned layer whose magnetization direction is pinned and a free layer whose magnetization direction can change according to an external magnetic field. The pinned layer is antiferromagnetic-coupled to an antiferromagnetic layer over the nonmagnetic layer, so that its magnetization direction is stably pinned. The resistance change rate of the GMR device of the pseudo spin valve type having a stacked structure of NiFe/Cu/Co is about 6 to 8% and that of the GMR device of the spin valve type having a stacked structure of PtMn/CoFe/Cu/CoFe is about 10%. Consequently, a sufficient read output obtained by detecting the resistance difference as the current or voltage difference is not yet obtained, and it is difficult to improve storage capacity and access speed.

With respect to this point, the resistance change rate of an MRAM using a tunneling magneto-resistive (TMR) effect (hereinafter, abbreviated as TMR-MRAM) can be largely increased. The TMR effect is a phenomenon such that the tunnel current passing through an insulating layer changes in accordance with relative angles of the magnetization directions of two ferromagnetic layers stacked while sandwiching a very-thin insulating layer (a pinned layer whose magnetization direction is pinned and a magneto-sensitive layer, that is, a free layer whose magnetization direction can be changed). When the magnetization directions of the two ferromagnetic layers are parallel with each other, the tunnel current becomes the maximum (the resistance value of the cell becomes the minimum). In the case where the magnetization directions are anti-parallel with each other, the tunnel current becomes the minimum (the resistance value of the cell becomes the maximum). As a concrete example of the TMR device, a TMR device having a stacked structure of CoFe/aluminum oxide/CoFe is known. The resistance change rate of the TMR device is 40% or higher.

Since the resistance of the TMR device is high, the TMR-MRAM can be easily matched with a semiconductor device such as a MOSFET (Metal Oxide Semiconductor Field Effect Transistor). From the above advantages, the TMR-MRAM can easily obtain a higher output as compared with the GMR-MRAM, and improvement in storage capacity and access speed is expected. TMR-MRAM techniques disclosed in U.S. Pat. No. 5,629,922 and Japanese Patent Laid-open No. Hei 9-91949 and the like are known.

The TMR-MRAM employs a method of writing information by changing the magnetization directions of the ferromagnetic layers by using current magnetic field led by current passed to the conductor. By the method, binary information is stored in correspondence with the relative magnetization directions (parallel or anti-parallel) of the ferromagnetic layers. It employs a method of reading stored information by passing current in the direction perpendicular to the layer surface and detecting a tunnel current value or tunnel resistance. In this case, the difference between the relative magnetization directions (parallel or anti-parallel) of the ferromagnetic layers appears as the difference between output current values or cell resistance values.

A cell array structure in which a plurality of TMR devices are connected in parallel on a data line and a semiconductor device for selection is disposed for each TMR device, and a cell array structure in which each of TMR devices is disposed for each data line are proposed. As the semiconductor device, a diode constructed by short-circuiting the gate and drain of a MOSFET or FET, a pn junction diode, a Schottky diode, or the like is used. Another structure is also proposed in which TMR devices are disposed in matrix by using row data lines and column data lines and a transistor for selection is disposed for each data line.

Among the structures, a structure having the most excellent characteristic from the viewpoint of power efficiency in reading operation is the structure in which the semiconductor device for selection is disposed for each of the TMR devices. In the case where the characteristics of the semiconductor devices are various, noise which occurs due to the variations is ignorable. In addition, when noise connected to the data line, noise caused by variations in the characteristics of the sense amplifiers, and noise of peripheral circuits entering from the power source circuit are also considered, there is the possibility that the S/N ratio of the output voltage of a storage cell is only a few dB.

Therefore, to improve the S/N ratio of a read output, the cell array of the TMR-MRAM has been improved as follows.

A method of comparing an output voltage V of a selected storage cell with a reference voltage Vref and amplifying the difference voltage Vsig is often used. The first purpose of the differential amplification is to remove noise which occurs in a data line pair to which the storage cell is connected. The second purpose is to remove an offset of the output voltage caused by characteristic variations in semiconductor devices for driving sense line or for cell selection. However, a circuit for generating the reference voltage Vref is realized by a circuit using a dummy cell and a semiconductor device and characteristic variations of the devices exist between the circuit and the storage cell. Consequently, it is theoretically impossible to completely remove the offset of the output voltage.

As a method of solving the problem, a method of constructing a storage cell by a pair of TMR devices and amplifying the difference between outputs of the devices in the pair is generally widely known. In the method, information is written so that the magnetization directions of magneto-sensitive layers of the paired TMR devices are always anti-parallel with each other. To be specific, data is written in a complementary manner so that the magnetization of the magneto-sensitive layer and that of the pinned layer are parallel with each other in one of the devices, and the magnetization directions in the other device are anti-parallel with each other. The difference between outputs of the two devices is amplified and the amplified data is read, thereby removing common-mode noise and improving the S/N ratio. Such circuit configurations of the differential amplification type are disclosed in Japanese Patent Laid-Open Nos. 2001-236781 and 2001-266567, ISSCC 2000 Digest paper TA7.2, and the like.

More concretely, in techniques disclosed in Japanese Patent Laid-Open Nos. 2001-236781 and 2001-266567, one ends of first and second TMR devices constructing a storage cell are separately connected to first and second data lines in a pair, and the other ends are connected to a bit line via the same semiconductor device for cell selection. A word line is connected to the semiconductor device for cell selection. Information is read by giving a potential difference between the bit line and the first and second data lines while maintaining the first and second data lines to be equipotential and using, as an output, the difference value between amounts of currents flowing in the first and second data lines.

Generally in the differential amplification methods, however, variations in resistance values of paired TMR devices are an issue. The TMR devices have variations in resistance values which occur in a manufacturing process, and a current error caused by the variations cannot be avoided. Due to this, in spite of the configuration that one ends of the first and second TMR device are separately connected to the first and second data lines and the other ends are connected to the bit line via the same semiconductor device for cell selection, deterioration in the S/N ratio of an output signal due to variations in resistance values has not been solved yet.

In the above wiring structure, a number of TMR devices are connected to the first and second data lines, and semiconductor devices for cell selection of the number equal to the number of cells in the bit line direction are connected to the third bit line, thereby constructing a matrix of storage cells. Consequently, to obtain a stable read signal output, it is necessary to sufficiently suppress resistance variations among the TMR devices connected to each data line and characteristic variations among the semiconductor devices for cell selection connected to the same bit line. However, the reading method which gives an equipotential voltage difference between the first and second data lines cannot suppress the variations in theory. There is, consequently, a problem such that it is extremely difficult to take a countermeasure against noise which occurs due to the variations.

For such reasons, although countermeasures have been proposed one after another, in a conventional MRAM, the S/N ratio of a read signal cannot be sufficiently improved. As a result, in spite of the fact that the resistance change rate of the TMR device reaches about 40%, a sufficient output voltage is not obtained in reality. That is, the existing memory structure already has the problem in operation stability such as read precision. Moreover, it is expected that the memory structure is not ready for future increase in packing density of a memory.

Further, as described above, although the reading method of the TMR-MRAM and the configuration of the read circuit have been being variously devised, the structure of the TMR device itself has not been particularly improved.

Since the number of parts such as semiconductor devices built in the read circuit increases as the packing density of a memory increases, it is concerned that the power consumption of the whole memory device increases considerably.

DISCLOSURE OF THE INVENTION

The present invention has been achieved in consideration of the problems and an object of the invention is to provide a magnetic memory device capable of performing reading operation with excellent operation stability such as read precision and high reliability with less power consumption, and a method of reading the magnetic memory device.

A magnetic memory device of the invention includes plural magnetoresistive devices each having a magneto-sensitive layer whose magnetization direction changes according to an external magnetic field and is constructed so that each of storage cells includes a pair of magnetoresistive devices. The magnetic memory device includes: a read line pair provided so as to extend in a first direction in each of the pairs of magnetoresistive devices and supplying a read current to the pair of magnetoresistive devices; a ground-side read line for guiding the read current passed through the pair of magnetoresistive devices to the ground; a constant current circuit commonly provided for plural ground-side read lines and making the sum of a pair of read currents passing through the pair of magnetoresistive devices in one storage cell constant; and a read circuit for reading information from the storage cell on the basis of the difference between the pair of read currents. The "external magnetic field" denotes a magnetic field generated by the write current.

In the magnetic memory device of the invention, the sum of the pair of read currents flowing in the pair of magnetoresistive devices in each storage cell is made constant by the action of the constant current circuit commonly provided for the plural ground-side read lines for guiding the read currents passed through the pair of magnetoresistive devices to the ground. Consequently, the read currents are controlled so that the pair of read currents flow always only by a predetermined amount, and variations in the output currents among storage cells are reduced.

In the magnetic memory device of the invention, the constant current circuit is disposed between the plural magnetoresistive devices and the ground, and may be constructed by using a bandgap reference. In this case, it is desirable that the constant current circuit include: a current control transistor; a diode connected between a base of the current control transistor and the ground; and a current control resistor connected between the emitter of the current control transistor and the ground.

Preferably, the magnetic memory device of the invention further includes a pair of rectifiers provided on a current path of the read current supplied to the pair of magnetoresistive devices. With the configuration, the read current can be prevented from flowing back from the ground-side read line to the magnetoresistive devices.

In this case, the pair of rectifiers may be provided between the pair of magnetoresistive devices and the ground-side read line or between the read line pair and the pair of magnetoresistive devices. In the case where the rectifier is a Schottky diode or a PN junction diode, for example, a first semiconductor switch for selecting one of plural second-direction storage cell groups arranged in a second direction as a word line direction orthogonal to the first direction as a bit line direction of the magnetic memory device may be provided between the constant current circuit and each of the plural ground-side read lines. As the rectifier, a rectifier also functions as a second semiconductor switch for selecting one of plural second-direction storage cell groups arranged in the second direction orthogonal to the first direction may be used. As the second semiconductor switch, a bipolar transistor or MOS transistor is suitable.

In the magnetic memory device, information can be read by using the phenomenon that the current values are different from each other in the case where current is passed in the direction perpendicular to the layer face in accordance with relative magnetization directions of the magneto-sensitive layers of the pair of magnetoresistive devices.

Regarding reading of information, preferably, read currents are supplied to the pair of magnetoresistive devices from the read lines in the read line pair, and information is read from the storage cell on the basis of the difference between the pair of read currents. According to the method, the read currents are differentially output, so that noise occurring in the read lines in the read line pair and an offset component included in an output value of each magnetoresistive device is offset and removed. The "rectifier" in the invention is a device of passing current only in one direction and checking passage of current in the opposite direction. The "current path" denotes a whole path of read current passing to flow into the magnetoresistive device, passing the magnetoresistive device, and flowing out. The rectifier has a rectifying action of passing current toward the ground (ground-side read line side) on the current path. By the rectifier, current from another storage cell connected to the common ground-side read line can be prevented from flowing in a storage cell to be read.

The magnetic memory device of the invention may further include: a read common line provided for each of the plural first-direction storage cell groups arranged in the first direction and combining plural ground-side read lines for each first-direction storage cell group to one line; and a selection switch provided between each of the plural read common lines and the constant current circuit and selecting one of the plural first-direction storage cell groups. In this case, the selection switch is controlled to be open/close by a selection signal for selecting one of the plural first-direction storage cell groups to which read current is passed.

Preferably, the magnetic memory device of the invention further includes plural first write lines and plural second write lines extending so as to cross the plural first write lines. Each of the pair of magnetoresistive devices includes: a stacked body including a magneto-sensitive layer whose magnetization direction changes according to an external magnetic field and constructed so that current flows in a direction perpendicular to a stack face; and a toroidal magnetic layer provided so that its axial direction is a direction along the stack face on the side of one of faces of the stacked body and constructed so as to be penetrated by the first and second write lines.

The "external magnetic field" denotes a magnetic field generated by the currents flowing in the first and second write lines and a reflux magnetic field generated in the toroidal magnetic layer. The "toroidal" of the "toroidal magnetic layer" denotes a state where, when it is seen from the first and second write lines penetrating the toroidal magnetic layer, the layer magnetically and electrically continuously completely surrounds each of the first and second write lines and the section in the direction crossing the first or second write line is closed. Therefore, the toroidal magnetic layer allows that an insulator is included as long as the toroidal magnetic layer is magnetically and electrically continuous. Obviously, an oxide film which is generated in a manufacture process may be included. The "axial direction" is an opening direction when attention is paid to the singular toroidal magnetic layer, that is, the extending direction of the first and second write lines penetrating the inside. Further, the state where "provided . . . on the side of one of faces of the stacked body" includes not only a case where the toroidal magnetic layer is provided as a member separate from the stacked body on the side of one of faces of the stacked body but also a case where the toroidal magnetic layer is provided so as to include part of the stacked body.

In the magnetic memory device of the invention, by using two magnetoresistive devices each capable of storing one-unit information, one-unit information is stored. Each of the magnetoresistive devices forms a closed magnetic path in the toroidal magnetic layer by passing current to the first and second write lines. Consequently, the current flowing in the direction perpendicular to the stack face of the stacked body flows from the magneto-sensitive layer to the toroidal magnetic layer.

In the magnetic memory device of the invention, preferably, magnetization directions of the magneto-sensitive layers in the pair of magnetoresistive devices change so as to be anti-parallel with each other by a magnetic field generated by currents flowing in the first and second write lines penetrating the toroidal magnetic layer, thereby storing information in the storage cell. The state where "the magnetization directions are anti-parallel with each other" in the invention includes not only a case where the angle formed by the magnetization directions, that is, the directions of averaged magnetizations in the magnetic layers is strictly 180 degrees but also a case where the angle formed by the magnetization directions is deviated from 180 degrees only by predetermined angles due to an error which occurs in manufacture, an error which occurs when the axes do not become completely a single axis, and the like. The "information" generally denotes binary information expressed by "0" and "1" in an input/output signal to/from the magnetic memory device or "high" and "low" by current values or voltage values.

In the magnetic memory device, information is stored in a state where the magnetization directions of the magneto-sensitive layers become anti-parallel with each other in the pair of magnetoresistive devices.

More concretely, information is preferably stored in the storage cell in accordance with: a first state in which one of the pair of magneto-sensitive layers in the pair of magnetoresistive devices is magnetized in a first magnetization direction and the other magneto-sensitive layer is magnetized in a second magnetization direction anti-parallel with the first magnetization direction; or a second state in which one of the pair of magneto-sensitive layers is magnetized in the second magnetization direction and the other magneto-sensitive layer is magnetized in the first magnetization direction. At this time, the magnetization directions of the magneto-sensitive layers in the pair of magnetoresistive devices have two states; a state in which they are parallel with each other, and a state where they are anti-parallel with each other. The binary information corresponds to the two states.

The invention also provides a method of reading a magnetic memory device including plural magnetoresistive devices each having a magneto-sensitive layer whose magnetization direction changes according to an external magnetic field and constructed so that each of storage cells includes a pair of magnetoresistive devices, including the steps of: supplying a read current to the pair of magnetoresistive devices via a read line pair provided so as to extend in a first direction in each of the pairs of magnetoresistive devices; guiding the read current passed through the pair of magnetoresistive devices to the ground via a ground-side read line; making the sum of a pair of read currents passing through the pair of magnetoresistive devices in one storage cell constant by a constant current circuit commonly provided for plural ground-side read lines; and reading information from the storage cell on the basis of the difference between the pair of read currents.

In the method of reading a magnetic memory device of the invention, read currents are supplied to the pair of magnetoresistive devices via the read line pair extending in the first direction. The read currents passed through the pair of magnetoresistive devices are guided to the ground via the ground-side read line. By commonly providing the constant current circuit for the plural ground-side read lines, the sum of the pair of read currents flowing in the pair of magnetoresistive devices in one storage cell is made constant. On the basis of the difference between the pair of read currents, information is read from the storage cell. Consequently, the read current is controlled so that the pair of read currents flow only by a predetermined amount, and variations in the output currents are reduced among the storage cells.

BEST MODE FOR CARRYING OUT THE INVENTION

Figure 1:
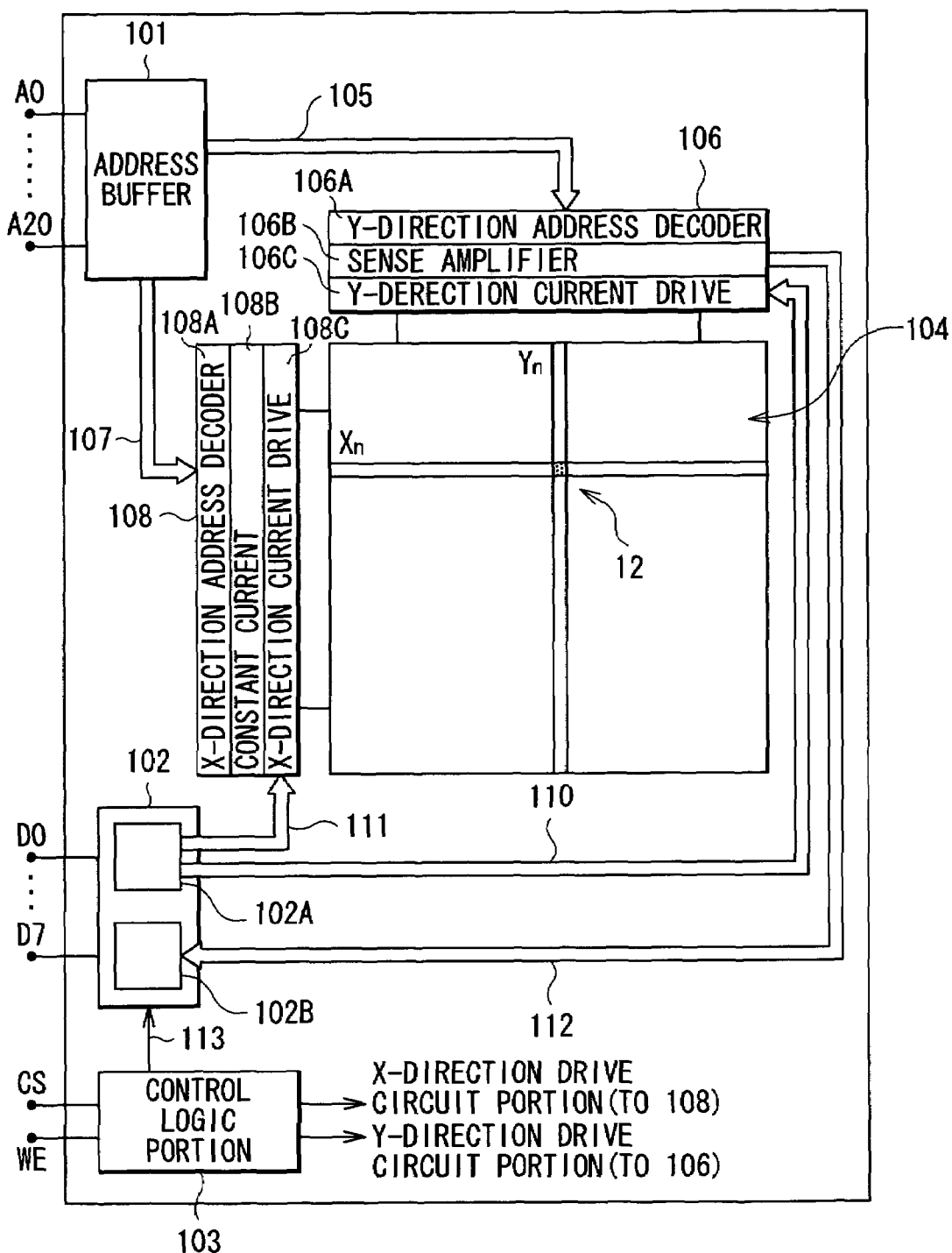
FIG. 1 is a block diagram showing a general configuration of a magnetic memory device according to a first embodiment of the invention.

Embodiments of the invention will now be described in detail hereinbelow by referring to the drawings.

First Embodiment

FIG. 1 is a diagram showing a general configuration of a magnetic memory device according to an embodiment of the invention. The magnetic memory device is an MRAM embodied as a so-called semiconductor memory chip and has, as main components, an address buffer 101, a data buffer 102, a control logic portion 103, a storage cell group 104, a Y-direction drive circuit portion 106, and an X-direction drive circuit portion 108. In the embodiment, the storage cell group 104 is disposed in a large area in the center of a silicon chip of the magnetic memory device, and circuit parts and wires such as the drive circuit portions 106 and 108 are mounted in a small area in the periphery.

The storage cell group 104 is obtained by disposing a number of storage cells 12 in a word line direction (X direction) and a bit line direction (Y direction) so as to form a matrix as a whole. Each of the storage cells 12 is the minimum unit of storing data. In each of the storage cells 12, bit data of "1" or "0" is stored. Each of the columns of the storage cells 12 in the storage cell group 104 will be called a word line $X_n$, and each of the rows will be called a bit low $Y_n$.

The Y-direction drive circuit portion 106 is constructed by a Y-direction address decoder 106A, a sense amplifier 106B for reading, and a Y-direction current drive 106C for writing, each of which is connected to the bit lines $Y_n$ ($Y_1$, $Y_2$, ...) in the storage cell 12 to the storage cell group 104.

The X-direction drive circuit portion 108 is constructed by an X-direction address decoder 108A, a constant current circuit 108B for reading, and an X-direction current drive 108C for writing, each of which is connected to the word lines $X_n$ ($X_1$, $X_2$, ...) in the storage cell 12 to the storage cell group 104. Therefore, for example, a storage cell 12 is unconditionally selected by addresses ($X_n$, $Y_n$) in the word direction and the bit direction input from the X-direction address decoder 108A and the Y-direction address decoder 106A as shown in the diagram.

The address buffer 101 has external address input terminals A0 to A20 and is connected to the Y-direction address decoder 106A and the X-direction address decoder 108A via address lines 105 and 107, respectively. The address buffer 101 has the function of receiving an address signal for selecting the storage cell 12 from the external address input terminals A0 to A20 and amplifying the address signal to a voltage level required in the Y-direction address decoder 106A and the X-direction address decoder 108A (hereinbelow, simply called address decoders 106A and 108A when they do not have to be distinguished from each other) by an internal buffer amplifier. The address buffer 101 also separates the amplified selection signal into two selection signals in the word line direction (X direction) and the bit line direction (Y direction) of the storage cell 12 and supplies the selection signals to the address decoders 106A and 108A. When the magnetic memory device has a plurality of storage cell groups 104, an address signal for selecting one storage cell group 104 from the plurality of storage cell groups 104 is also input. The bit line direction (Y direction) corresponds to a "first direction" in the invention, and the word line direction (X direction) corresponds to a "second direction" in the invention.

The data buffer 102 has external data terminals D0 to D7 for transmitting/receiving digital data signals to/from the outside and is connected to the control logic portion 103 via a control signal line 113. The data buffer 102 includes an input buffer 102A and an output buffer 102B each of which operates in response to a control signal from the control logic portion 103. The input buffer 102A is connected to the Y-direction current drive 106C and the X-direction current drive 108C via write data buses 110 and 111, respectively. The input buffer 102A has the function of receiving data signals from the external data terminals D0 to D7 at the time of writing data to the memory device, amplifies the data signals to a required voltage level by an internal buffer amplifier, and outputting the resultant signals to the Y-direction and X-direction current drives 106C and 108C (hereinbelow, simply called current drives 106C and 108C when they do not have to be distinguished from each other). The output buffer 102B is connected to the sense amplifier 106B via the read data bus 112. By using the internal buffer amplifier, the output buffer 102B has the function of outputting a read data signal that is input from the sense amplifier 106B at the time of reading data wit low impedance from the memory device to the external data terminals D0 to D7. By using the internal buffer amplifier, the output buffer 102B has the function of outputting a read data signal that is input from the sense amplifier 106B at the time of reading data wit low impedance from the memory device to the external data terminals D0 to D7.

The control logic portion 103 has an input terminal CS and an input terminal WE and is connected to the data buffer 102 via the control signal line 113. The control logic portion 103 performs an operation control on the storage cell group 104. To the control logic portion 103, a signal (chip select CS) indicative of whether an operation of writing/reading data to/from a magnetic memory device is made active or not is input from the input terminal CS, and a write enable signal WE for switching between writing and reading is input from the input terminal WE. The control logic portion 103 has the function of amplifying signal voltages received from the input terminals CS and WE to voltage levels necessary in the Y-direction and X-direction drive circuit portions 106 and 108 (hereinbelow, simply called drive circuit portions 106 and 108 when they do not have to be distinguished from each other) by an internal buffer amplifier.

Configuration of Reading Circuit

The configuration of a reading circuit of the magnetic memory device will now be described.

Figure 2:
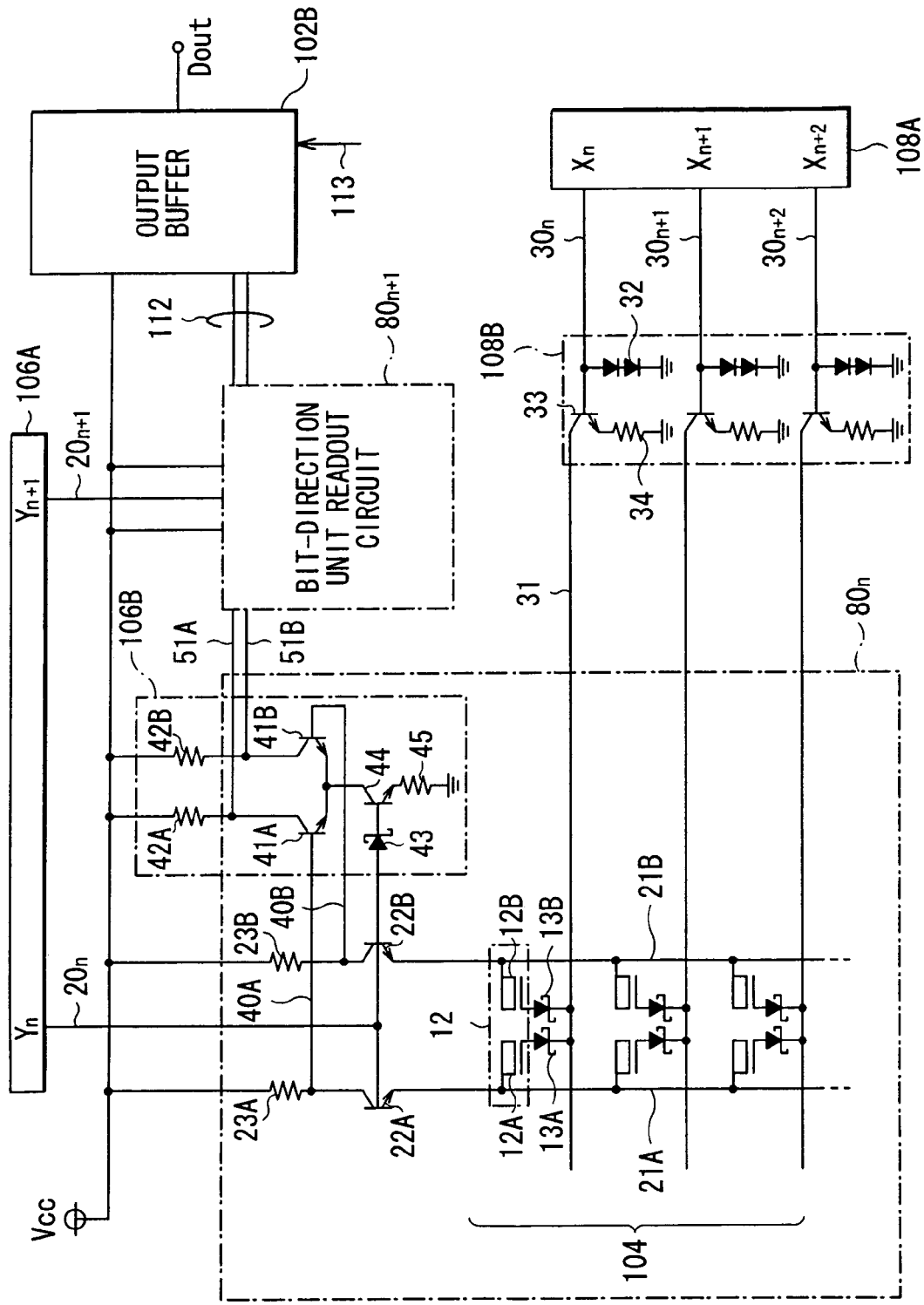
FIG. 2 is a plan view showing the configuration of a storage cell in the magnetic memory device illustrated in FIG. 1 and a read circuit.

FIG. 2 is a diagram showing a circuit system constructed by the storage cell group and a circuit for reading the storage cell group. The read circuit system is a differential amplifier in which each of the storage cells 12 includes a pair of magnetoresistive devices 12A and 12B. Information in each of the storage cells 12 is read by outputting the difference between sensing currents passed to the magnetoresistive devices 12A and 12B. The sensing current is current that flows from bit decode lines 21A and 21B for sensing (which will be described later) to the magnetoresistive devices 12A and 12B and flows out to a common word decode line 31 for sensing (which will be described later). The pair of magnetoresistive devices 12A and 12B are a concrete example of "a pair of magnetoresistive devices" in the present invention.

In FIG. 2, a bit-direction unit readout circuit 80 ( . . . , $80_n$, $80_{n+1}$, . . . ) as a repetition unit of the read circuit is constructed by the storage cells 12 in the bit line $Y_n$ in the storage cell group 104 and a part of the read circuit including the sense amplifier 106B. Each of the bit-direction unit readout circuits 80 ( . . . , $80_n$, $80_{n+1}$, . . . ) is connected to the Y-direction address decoder 106A via a bit decode line 20 ( . . . , $20_n$, $20_{n+1}$, . . . ) and is connected to the output buffer 102B via the read data bus 112. Since all of the bit-direction unit readout circuits 80 cannot be drawn due to the limited space in the diagram, representative two circuits are drawn. Similarly, in the storage cell group 104, representative two bit lines $Y_n$ and $Y_{n+1}$ are drawn.

The magnetoresistive devices 12A and 12B of each storage cell 12 will be described as TMR devices using the TMR effect and their detailed configurations will be described later.

For the storage cell group 104, wiring is conducted in a matrix by the word decode lines 31 for sensing disposed in the X direction (hereinbelow, simply called sense word lines 31) and the pair of bit decode lines 21A and 21B disposed in the Y direction (hereinbelow, simply called sense bit lines 21A and 21B). Each of the storage cells 12 is disposed in the intersecting position of the word decode line 31 and the pair of bit decode lines 21A and 21B. The storage cell 12 connected in parallel with the common sense bit lines 21A and 21B serves as a component of the bit line $Y_n$, and the storage cell 12 cascaded to the common sense word line 31 serves as a component of the word line $X_n$.

In one storage cell 12, one ends of the magnetoresistive devices 12A and 12B are connected to the sense bit lines 21A And 21B, respectively, and the other ends are connected to the common sense word line 31 via a pair of backflow prevention diodes 13A and 13B. A current path of the sensing current to each of the magnetoresistive devices 12A and 12B extends from a node between a conductor from the device and corresponding one of the sense bit lines 21A and 21B to a node between a conductor from the device and the sense word line 31. The sense bit lines 21A and 21B correspond to "a pair of read lines" of the present invention, and the sense word line 31 corresponds to a "ground-side read line" of the invention.

Connection in Bit Line Direction

The sense bit lines 21A and 21B are paired and disposed for each bit line $Y_n$ ($Y_1$, $Y_2$, . . . ) of the storage cells 12. The sense bit lines 21A and 21B extend in the Y direction so as to penetrate the storage cell group 104 and one end of each of the sense bit lines 21A and 21B is connected to the power source Vcc. On the one end side (power source Vcc side) of the sense bit lines 21A and 21B, resistors 23A and 23B for current/voltage conversion (hereinafter, called resistors 23A and 23B) and the collector and emitter of the transistors 22A and 22B are connected in series. Further, each of the plurality of storage cells 12 constructing the bit line $Y_n$ is connected each of the sense bit lines 21A and 21B. Concretely, one end of the magnetoresistive device 12A in the storage cell 12 is connected to the sense bit line 21A, and one end of the magnetoresistive device 12B is connected to the sense bit line 21B.

Further, the bit decode line 20 is connected to the base side of each of the transistors 22A and 22B. The bit decode line 20 is connected to the Y-direction address decoder 106A. From the Y-direction address decoder 106A, a selection signal selectively output to the bit line $Y_n$ to which the storage cell 12 to be written/read belongs is supplied to the bit decode line 20. Specifically, the bit decode line 20 ( . . . , $20_n$, $20_{n+1}$, . . . ) is provided in correspondence with each of the bit lines $Y_n$ of the storage cells 12, and has the function transmitting a selection signal from the Y-direction address decoder 106A to the bit line $Y_n$ to be operated. The transistors 22A and 22B serve as a pair of semiconductor switches and open/close in accordance with the value of the selection signal (bit decode value) input from the bit decode line 20.

Although the bit decode line 20 and the sense bit lines 21A and 21B have the same decoding function, they are clearly distinguished from each other from the viewpoint of operation. Specifically, the bit decode line 20 is a signal line for transmitting a selection cell by the Y-direction address decoder 106A by a binary digital signal indicative of "High" or "Low". On the other hand, the sense bit lines 21A and 21B are analog signal lines for detecting a weak current flowing into the magnetoresistive devices 12A and 12B. The word decode line 30 and the sense word line 31 have a similar relation.

From nodes at the end on the side opposite to the power source Vcc of the resistors 23A and 23B connected to the sense bit lines 21A and 21B, sense amplifier input lines 40A and 40B (hereinbelow, called input lines 40A and 40B) are led. The resistors 23A and 23B function as bias resistors of the sense amplifier 106B. Specifically, the resistors 23A and 23B are disposed to convert the sensing current flowing from the power source Vcc to the sense bit lines 21A and 21B to voltage by a voltage drop of themselves and lead the voltage to the sense amplifier 106B via the input lines 40A and 40B. The resistors 23A and 23B also has the function of generating an intermediate voltage level lower than the voltage supplied from the power source Vcc only by $-\phi$. Since the sensing current is weak, to obtain a large voltage drop by the resistors 23A and 23B to increase the voltage value which is input to the input lines 40A and 40B as much as possible, the resistance value of the resistors 23A and 23B has to be increased. Therefore, it is preferable that the resistors 23A and 23B have a high resistance value such as 100 kΩ, at least, a resistance value larger than that of the magnetoresistive devices 12A and 12B.

Connection in Word Line Direction

To each of the sense word lines 31, the storage cells 12 disposed in the same word line $X_n$ ($X_1$, $X_2$, . . . ) are connected. In the embodiment, the backflow prevention diodes 13A and 13B (hereinbelow, simply called diodes 13A and 13B) as rectifiers are disposed between the storage cell 12 and the sense word line 31. The backflow prevention diodes 13A and 13B correspond to and are connected to the magnetoresistive devices 12A and 12B, respectively. The set of the magnetoresistive device 12A and the diode 13A and the set of the magnetoresistive device 12B and the diode 13B are insulated from each other.

The diodes 13A and 13B are provided as one-way devices for preventing backflow of current from the sense word line 31 to the magnetoresistive devices 12A and 12B. As the diodes 13A and 13B, for example, pn-junction diodes, Schottky diodes, diodes each obtained by short-circuiting the base and the collector of a bipolar junction transistor (BJT), diodes each obtained by short-circuiting the gate and the drain of a MOSFET, or the like can be used.

The collector-emitter of the transistor 33 are connected to the ground side of the sense word line 31, and the word decode line 30 ( . . . , $30_n$, $30_{n+1}$, . . . ) is disposed in correspondence with the word line $X_n$ on the base side of the transistor 33. The word decode line 30 is connected to the X-direction address decoder 108A. The word decode line 30 has the function of receiving a selection signal of selecting the word line $X_n$ from the X-direction address decoder 108A and transmitting the selection signal to the base side of the transistor 33.

The transistor 33 functions as a semiconductor switch which switches on/off according to the value (bit decode value) of the selection signal input to the base, and controls conduction/interruption of the sense word line 31. As the transistor 33, for example, a BJT or MOSFET can be used. On the emitter side of the transistor 33, a current control resistor 34 is provided.

In the embodiment, on the ground side of the sense word line 31, the constant current circuit 108B is also provided. The constant current circuit 108B has the function of making the current flowing in the sense word line 31 constant and includes the diode 32 for generating constant voltage, transistor 33, and current control register 34. Therefore, the transistor 33 has the current control function of passing constant current across the collector and the emitter in addition to the function of the semiconductor switch for word decoding. The base side of the transistor 33 is also connected to the anode of the diode 32. In this case, the diode 32 is obtained by connecting two diodes in series.

Circuit Configuration of Sense Amplifier

One sense amplifier 106B is provided per bit-direction unit readout circuit 80 and has the function of receiving the potential difference between the pair of sense bit lines 21A and 21B in the bit-direction unit readout circuit 80 and amplifying the potential difference. The sense amplifier 106B of each bit-direction unit readout circuit 80 is connected to the corresponding sense bit lines 21A and 21B via the input lines 40A and 40B. All of the sense amplifiers 106B are connected to common sense amplifier output lines 51A and 51B (hereinafter, called output lines 51A and 51B) and are finally connected to the output buffer 102B via the read data bus 112.

The sense amplifier 106B itself is constructed as a so-called differential amplifier and has an amplification stage constructed by transistors 41A and 41B, resistors 42A and 42B as bias resistors for obtaining a voltage output, a diode 43 for dropping voltage, a transistor 44 having a current control function and a selection switch function, and a resistor 45 for voltage drop.

Figure 3:
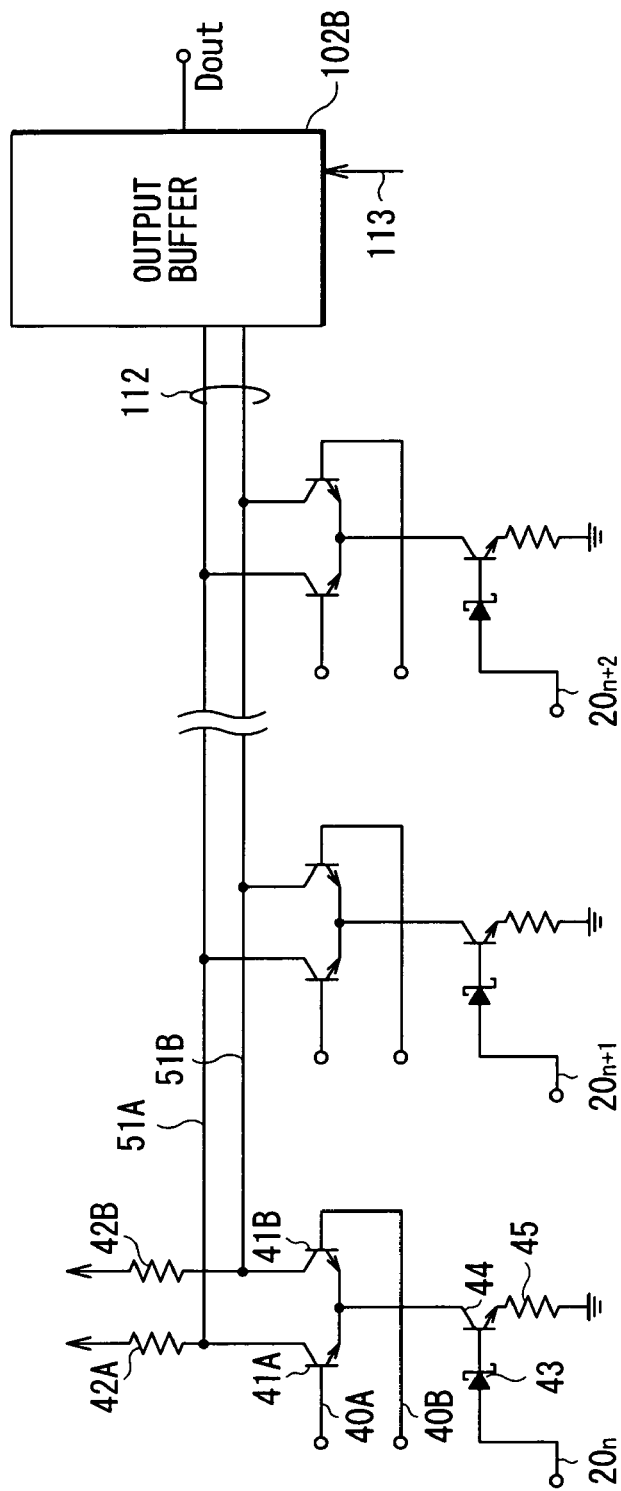
FIG. 3 is a circuit diagram illustrating the configuration of a whole sense amplifier in the read circuit shown in FIG. 2.

FIG. 3 shows a portion of the sense amplifier 106B extracted from the whole read circuit. The sense amplifier 106B provided for each bit-direction unit readout circuit 80 is cascaded to the output lines 51A and 51B. The resistors 42A and 42B are bias resistors shared by all of the sense amplifiers 106B cascaded.

In the transistors 41A and 41B, the input lines 40A and 40B are connected to the base side, and the resistors 42A and 42B are connected to the collector side (via the output lines 51A and 51B). The emitter side of the transistors 41A and 41B are connected to the collector side of the transistor 44.

The bit decode line 20 is connected to the base side of the transistor 44 via the diode 43, and the emitter side of the transistor 44 is grounded via the resistor 45. As the resistors 42A and 42B, it is desired to use resistors of high precision. It is important that the characteristics of the transistors 41A and 41B are identical.

The diode 43 is used to generate an intermediate voltage level by dropping the voltage level of the bit decode line 20 only by $-\phi$ by using its bandgap reference and to make the voltage value used as an input voltage on the base side of the transistor 44. The transistor 44 has both of the current limiting function and the function of the semiconductor switch which switches on/off in accordance with the bit decode value from the bit decode line 20.

The collector side of the transistors 41A and 41B of each sense amplifier 106B is connected to the output lines 51A and 51B, and further connected to the output buffer 102B via the output lines 51A and 51B and the read data bus 112.

The circuit layout pattern of the magnetic memory device in the embodiment will now be described with reference to FIGS. 4 to 6.

Figure 4:
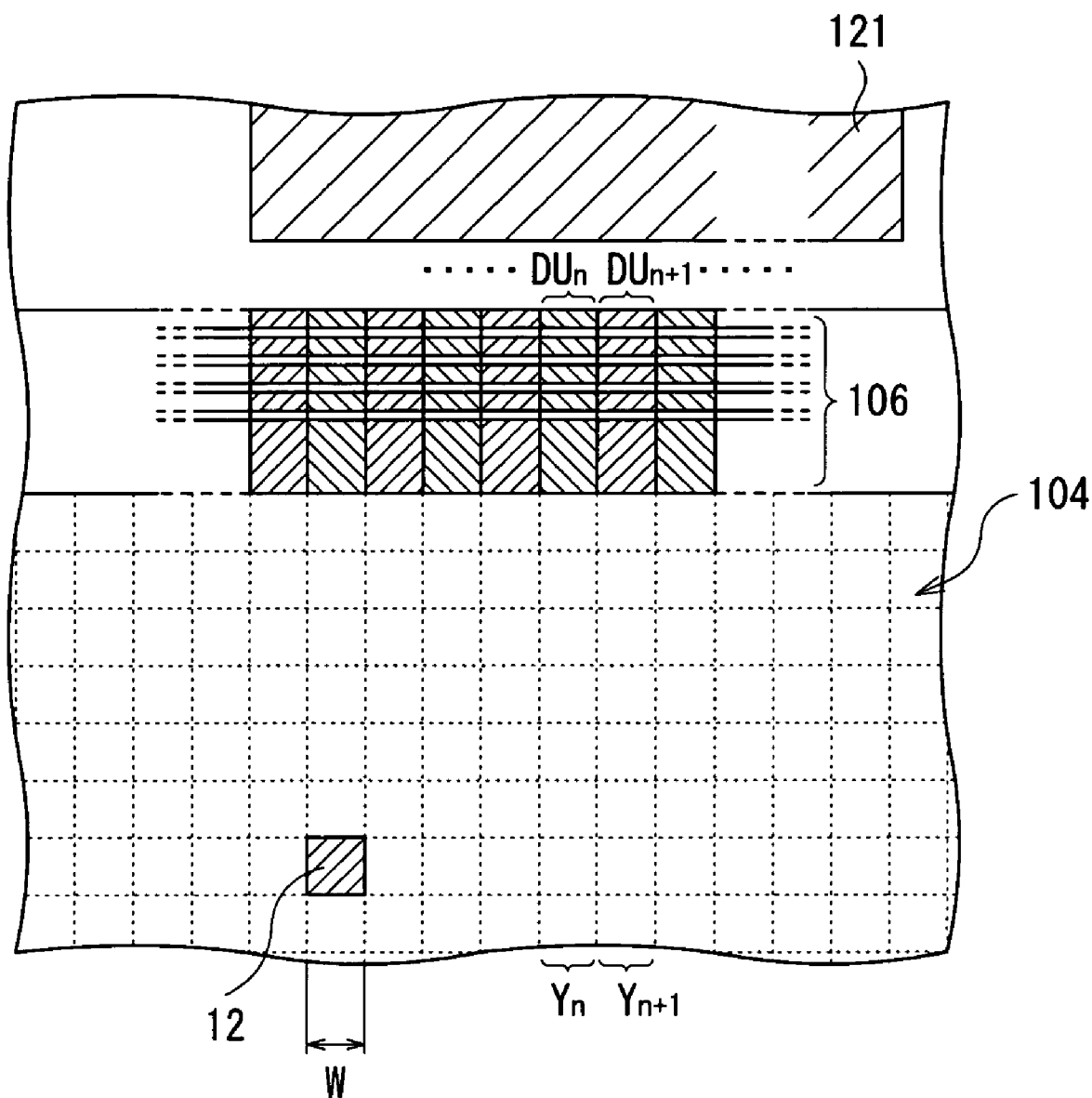
FIG. 4 is a configuration diagram showing a mounting state around a Y-direction drive circuit portion of a storage cell group illustrated in FIG. 1.
Figure 5:
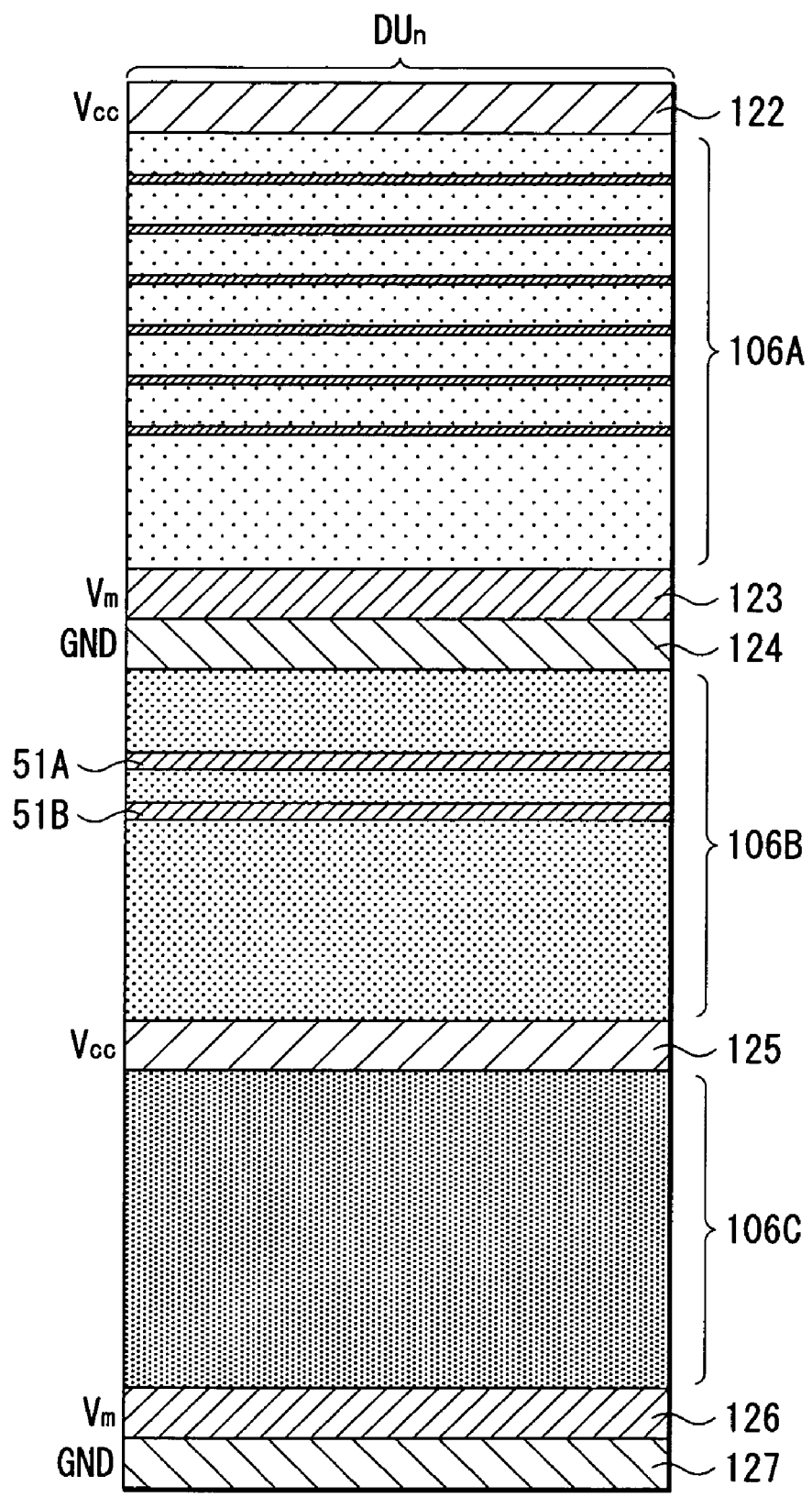
FIG. 5 is a diagram showing an actual circuit layout of the Y-direction drive circuit portion illustrated in FIG. 4.

FIG. 4 shows a mounting state around the Y-direction drive circuit portion of the storage cell group, and FIG. 5 shows an actual circuit layout of the Y-direction drive circuit portion. The Y-direction drive circuit portion 106 is formed in one side of the storage cell group 104, and a bonding pad 121 is provided above the Y-direction drive circuit portion 106. In the Y-direction drive circuit portion 106, as described above, each of the Y-direction address decoder 106A, sense amplifier 106B, and Y-direction current drive 106C is constructed by using a circuit corresponding to each bit line $Y_n$ ($Y_1$, $Y_2$, . . . ) as one configuration unit. In the embodiment, the one configuration units of the circuits 106A to 106C are combined every corresponding bit line $Y_n$ ($Y_1$, $Y_2$, . . . ), thereby obtaining a unit drive circuit $DU_n$ ($DU_1$, $DU_2$, . . . ). By forming the unit drive circuit $DU_n$ so that its width is within the width W of the storage cell 12, the unit drive circuit $DU_n$ is disposed at an end of the corresponding bit line $Y_n$.

FIG. 5 shows one unit drive circuit. The circuit area of the Y-direction address decoder 106A is formed between a power source line 122 (Vcc) and a power source line 123 (Vm) of an intermediate potential and a ground line 124 (GND). The power source line 123 of the intermediate potential is a voltage source for supplying a voltage corresponding to a bandgap $+2\Phi$ to a current limiting transistor, the constant current circuit 108B in the X direction, and the like. The address line 105 extends so as to cross in the circuit area. The Y-direction address decoder 106A of each unit driver circuit $DU_n$ is connected to the address line 105.

The circuit area of the sense amplifier 106B is formed between a power source line 125 and the power source line 123 of the intermediate potential and the ground line 124. In the area, output lines 51A and 51B extend so as to cross the area and wiring is conducted so that the sense amplifier 106B of each unit drive circuit $DU_n$ is cascaded to the output lines 51A and 51B. The circuit area of the Y-direction current drive 106C is formed between the power source line 125 and a power source line 126 of an intermediate potential and a ground line 127.

Figure 6:
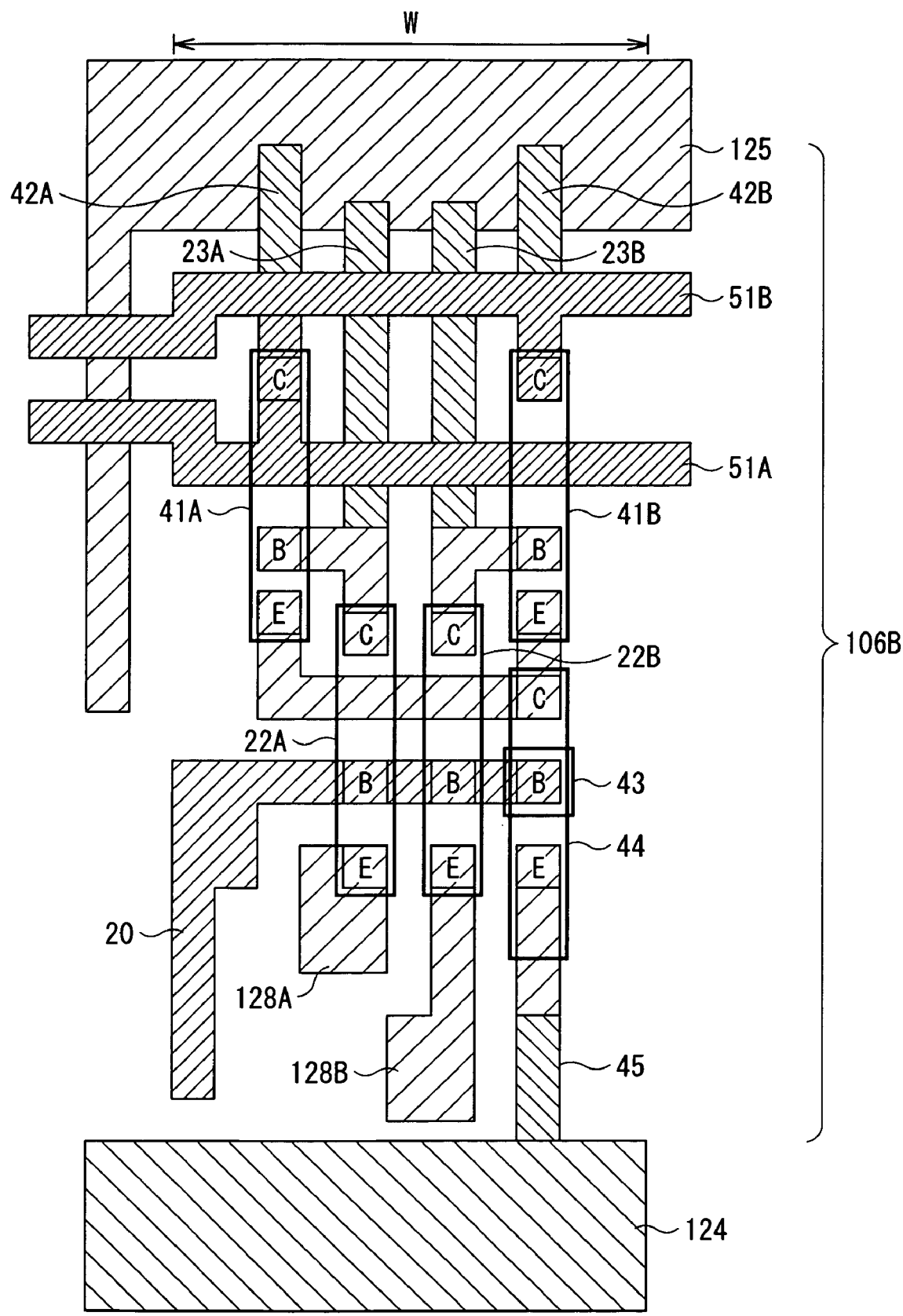
FIG. 6 is a pattern layout of a sense amplifier area in a unit drive circuit illustrated in FIG. 5.

FIG. 6 concretely shows a circuit pattern layout of only the sense amplifier in the unit drive circuit. As described above with reference to FIG. 2, the sense amplifier 106B is not only associated with each bit line $Y_n$ ($Y_1$, $Y_2$, . . . ) but also connected to the power source Vcc side of the sense bit lines 21A and 21B. In this case, the transistors 22A and 22B and the resistors 23A and 23B are integrated together with the sense amplifier 106B in the circuit area of the sense amplifier 106B.

When the circuit pattern layout is compared with the circuit diagrams of FIGS. 2 and 3, it is understood that the transistors 22A and 22B and the resistors 23A and 23B are paired on the inside of the pair of transistors 41A and 41B in the sense amplifier 106B. The via pads 128A and 128B are connected to the sense bit lines 21A and 21B, respectively. Although not shown in FIG. 6, the bit decode line 20 passes through the ground line 124 and is connected to the Y-direction address decoder 106A. To help the configuration to be understood, intentionally, the power source line 125 is drawn in the upper part and the ground line 124 is drawn in the lower part in FIG. 6 so that FIG. 6 corresponds to FIGS. 2 and 3, not FIG. 5.

All of the pair of transistors 22A and 22B, the pair of resistors 23A and 23B, and the sense amplifier 106B are differential pairs and it is important from the viewpoint of operation that the characteristics in the pair are identical. Although the characteristics are made identical in advance, output characteristics may become different from each other in cases such that the temperature conditions in mounting places of circuit elements vary. In contrast, in the embodiment, the circuit elements in the pair are disposed so as to be close to each other, so that they are subjected to the same temperature change. Consequently, the characteristics of the circuit elements change similarly and variation hardly occurs. Thus, a change in the output values, which occurs in association with a temperature change can be reduced.

Configuration of Storage Cell Group

The configuration of the magnetoresistive devices 12A and 12B and the storage cell 12 used in the embodiment will now be described.

Figure 7:
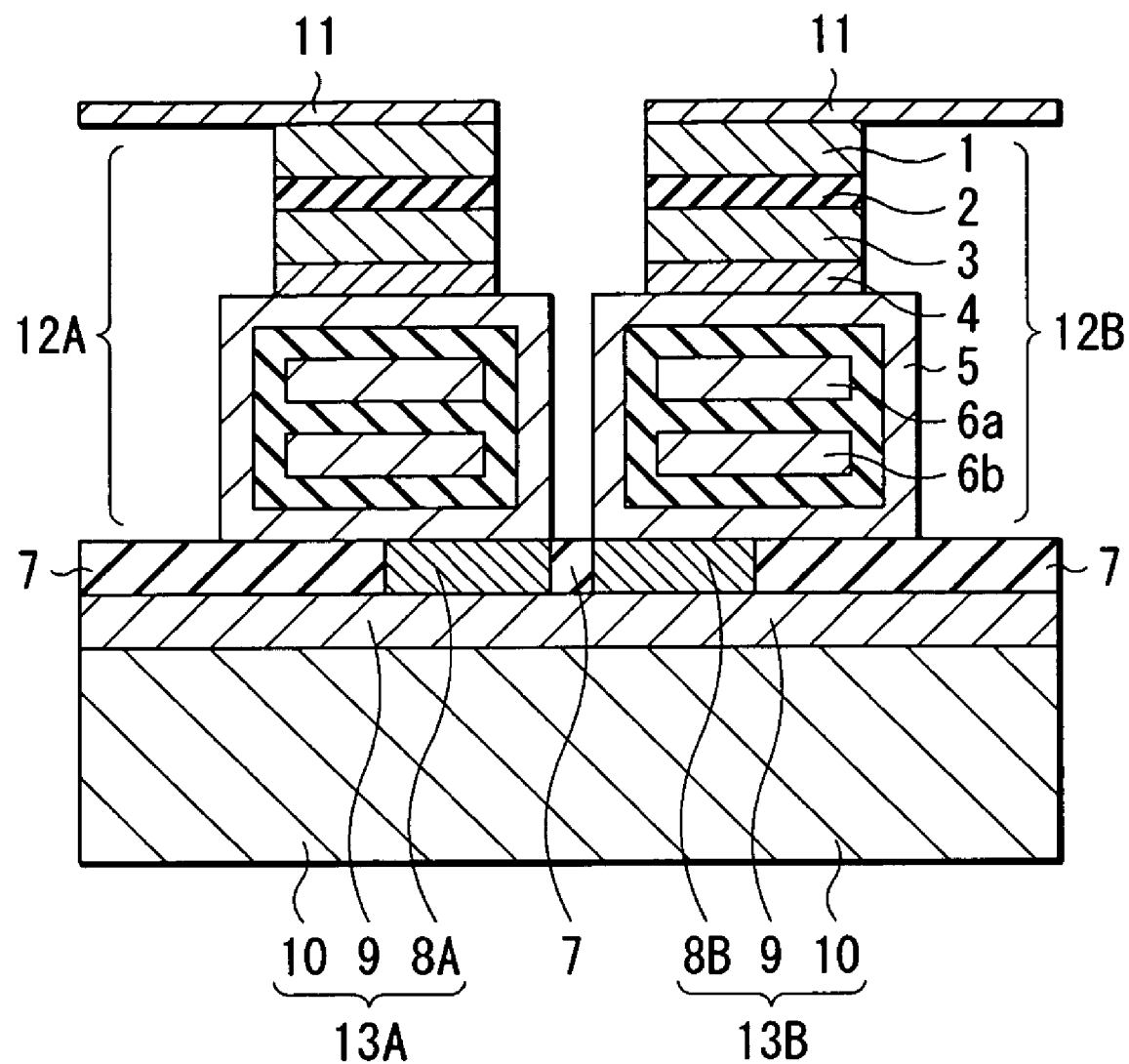
FIG. 7 is a cross section showing a concrete configuration of a storage cell illustrated in FIG. 1.

FIG. 7 is a cross section showing the configuration of the storage cell. In the storage cell 12, the pair of right and left magnetoresistive devices 12B and 12A is mounted over a substrate 10. Each of the magnetoresistive devices 12A and 12B has a configuration including a stacked body in which a first magnetic layer 1, a nonmagnetic layer 2, and a second magnetic layer 3 are stacked, and a toroidal magnetic layer 5 disposed by using a direction along a stacked surface as the axial direction on one of face sides of the stacked body and constructed so as to be penetrated by a write bit line 6a and a write word line 6b (first and second write lines). The second magnetic layer 3 and the toroidal magnetic layer 5 are bonded to each other over a nonmagnetic conductive layer 4 and are electrically connected to each other.

Each of the magnetoresistive devices 12A and 12B is provided with a read sensing conductor 11 on the top face (face on the side opposite to the toroidal magnetic layer 5) of the stacked body, so that current can be passed perpendicular to the stack surface of the stacked body toward the substrate 10.

The first magnetic layer 1 is a ferromagnetic layer whose magnetization direction is pinned, and the second magnetic layer 3 is a ferromagnetic layer (magneto-sensitive layer) whose magnetization direction changes according to an external magnetic field. The magnetic layers are stacked while sandwiching the nonmagnetic layer 2 which is very thin as a few nm (tens Å). In the stacked body, when a voltage in the perpendicular direction is applied to the stack surface between the first and second magnetic layers 1 and 3, for example, electrons in the second magnetic layer 3 penetrate the nonmagnetic layer 2 and move in the first magnetic layer 1, so that tunnel current flows. That is, the nonmagnetic layer 2 is a tunnel barrier layer. The tunnel current changes according to relative angles between spins in the first magnetic layer 1 and spins in the second magnetic layer 3 in the interface portion with the nonmagnetic layer 2. When the spin in the first magnetic layer 1 and that in the second magnetic layer 3 are parallel with each other, the resistance value of the magnetoresistive device 12A (12B) becomes the minimum. When they are anti-parallel with each other, the resistance value becomes the maximum.

The magnetization of the second magnetic layer 3 changes according to an induction field by the write bit line 6a and the write word line 6b. The magnetization of the second magnetic layer 3 is inverted by the induction field so that its angle relative to the magnetization of the first magnetic layer 1 is reversed. The storage cell 12 to be written is selected by the so-called matrix driving method, so that the magnetic characteristics, dimensions, and the like of the second magnetic layer 3 are set so that the magnetization is reversed only when current is passed in the same direction to not only one of the write bit line 6a and the write word line 6b, but both of them. This is the basic structure of the magnetoresistive device 12A (12B) as a TMR device.

The toroidal magnetic layer 5 has a cylindrical shape having the axis perpendicular to the drawing sheet of FIG. 7 and includes a part in which the write bit line 6a and the write word line 6b are parallel with each other. That is, the axial direction of the toroidal magnetic layer 5 is the direction of extension of the write bit line 6a and the write word line 6b and has a toroidal shape closed in the direction of a section crossing the axial direction. The toroidal magnetic layer 5 is made of a magnetic material having high magnetic permeability, and has the function of efficiently changing the magnetization direction of the second magnetic layer 3 by confining a magnetic flux generated by the currents of the write bit line 6a and the write word line 6b. The section of the toroidal magnetic layer 5 is a closed loop as shown in the diagram, and the generated induction field re-circulates in the layer along a surface parallel with the section. The toroidal magnetic layer 5 has an electromagnetic shielding effect which prevents a magnetic flux from being leaked to the outside. Since the toroidal magnetic layer 5 is constructed so as to be in contact with one surface of the second magnetic layer 3, the magnetic field can be easily transmitted to the second magnetic layer 3, and the magnetization direction of the second magnetic layer 3 positioned in proximity with high magnetic flux density can be changed more efficiently.

Figure 8:
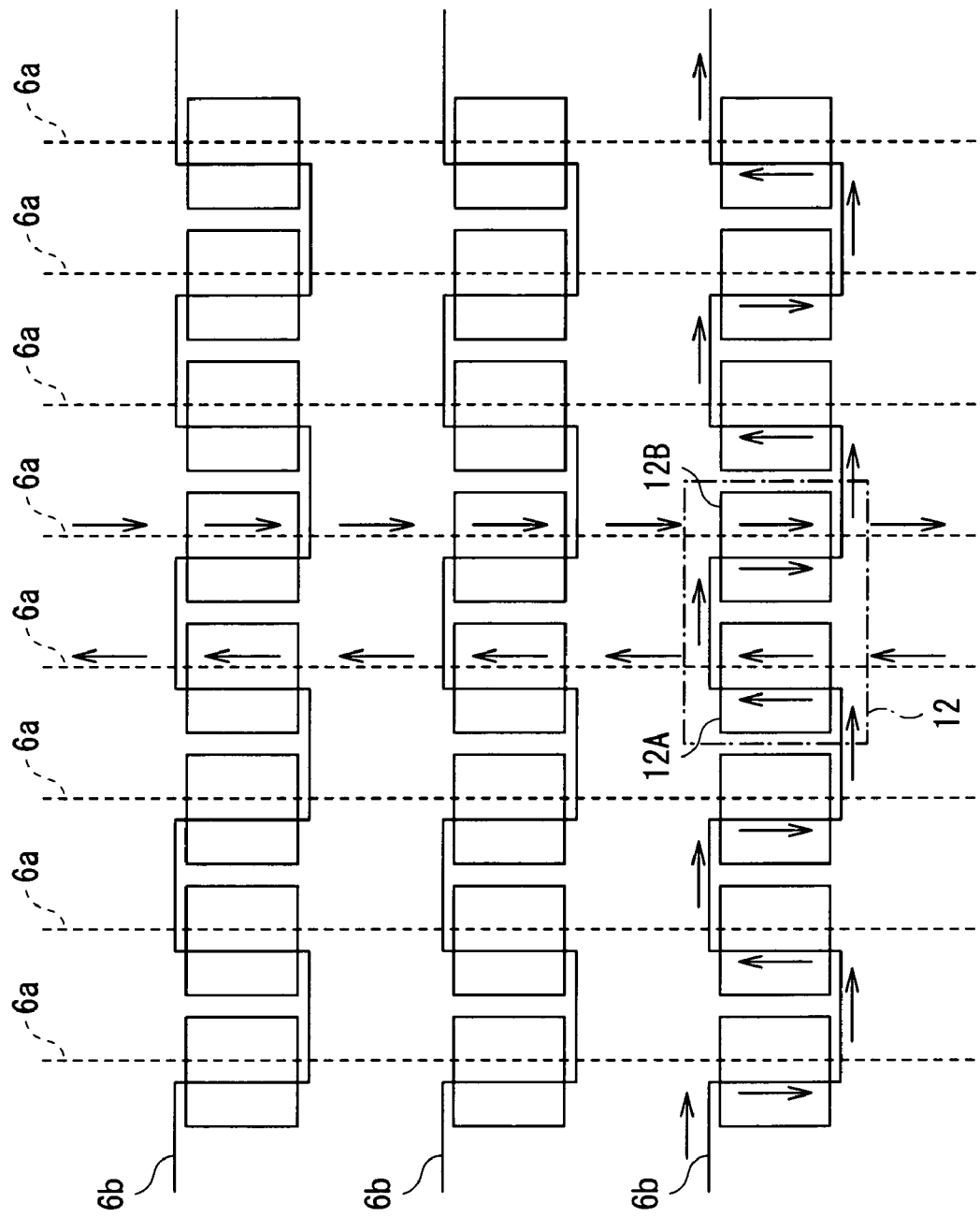
FIG. 8 is a diagram showing the structure of storage cells of the magnetic memory device illustrated in FIG. 1 and a wiring structure for writing.

FIG. 8 shows a wiring structure of the write bit line 6a and the write word line 6b. As shown in the diagram, the magnetic memory device of the embodiment has plural write bit lines 6a and plural write word lines 6b extending so as to cross the write bit lines 6a. Although they extend so as to cross each other, in an intersection area, they extend partly parallel with each other. In the parallel portion, the magnetoresistive devices 12A and 12B are formed. "Parallel" includes here a manufacturing error range of +−10°. In this case, the magnetization of the second magnetic layer 3 is reversed by using combined magnetic field of the write bit line 6a and the write word line 6b which are parallel with each other. The magnitude of the induction field is larger than the combined magnetic field when the wires cross each other. Therefore, writing operation can be performed efficiently.

To each of the magnetoresistive devices 12A (12B), current flows from the read sensing conductor 11 to the stacked body and passes from the toroidal magnetic layer 5 to the substrate 10. Therefore, conductive materials are used for all of the layers in the stacked body except for the nonmagnetic layer 2 to which tunnel current is passed, the nonmagnetic conductive layer 4 and the toroidal magnetic layer 5. For the first and second magnetic layers 1 and 3, for example, a cobalt iron alloy (CoFe) is used. Other than the cobalt iron alloy, a single cobalt (Co), a cobalt platinum alloy (CoPt), a nickel iron cobalt alloy (NiFeCo), or the like can be used. The first and second magnetic layers 1 and 3 are stabilized in a state where their magnetization directions are parallel or anti-parallel with each other. It is consequently desirable to make their axes of easy magnetization parallel with each other.

The thickness of the nonmagnetic layer 2 is determined on the basis of tunnel resistance or the like. Generally, in the magnetic memory device using the TMR device, to match with a semiconductor device such as a transistor, proper tunnel resistance is tens $k\Omega \cdot (\mu m)^2$. To realize higher packing density and higher operation speed in the magnetic memory device, the tunnel resistance is set to, preferably, 10 $k\Omega \cdot (\mu m)^2$ or less, more preferably, 1 $k\Omega \cdot (\mu m)^2$ or less. To realize such a tunnel resistance value, the thickness of the nonmagnetic layer 2 is preferably 2 nm or less, more preferably, 1.5 nm or less. When the nonmagnetic layer 2 is too thin, the tunnel resistance can be reduced. On the other hand, a leak current caused by roughness of the junction interface between the first and second magnetic layers 1 and 3 occurs and the MR ratio may deteriorate. To prevent this situation, the nonmagnetic layer 2 has to have a thickness with which leak current does not flow. Concretely, the thickness of the nonmagnetic layer 2 is desirably 0.3 nm or more.

The nonmagnetic conductive layer 4 functions to antiferromagnetic-couple the second magnetic layer 3 and the toroidal magnetic layer 5. For example, ruthenium (Ru), copper (Cu), or the like is used. For the toroidal magnetic layer 5, iron (Fe), nickel iron alloy (NiFe), Co, CoFe, NiFeCo, or the like can be used. To make the magnetic fields generated by the write bit line 6a and the write word line 6b concentrated in the toroidal magnetic layer 5, the magnetic permeability of the toroidal magnetic layer 5 is preferably as high as possible. Concretely, it is 2,000 or higher, more preferably, 6,000 or higher.

Each of the write bit line 6a and the write word line 6b has a structure in which titanium (Ti), titanium nitride (TiN), and aluminum (Al) are sequentially stacked and are electrically insulated from each other via insulating films. The write bit line 6a and the write word line 6b may be made of, for example, at least one of aluminum (Al), copper (Cu), and tungsten (W).

Although the magnetoresistive device 12A (12B) takes the form of a TMR device in the embodiment, it may be a CPP (Current Perpendicular to the Plane)-GMR device having a structure in which current is passed perpendicular to the stack surface of the magnetic layer. In this case, a device structure similar to that of the magnetoresistive device 12A (12B) except that the nonmagnetic layer 2 is changed from the insulating layer to a nonmagnetic metal layer can be employed.

On the substrate 10 over which the magnetoresistive devices 12A and 12B are formed, an epitaxial layer 9 is formed. On the epitaxial layer 9, a conductive layer 8 and an insulating layer 7 are formed. The conductive layer 8 is constructed by conductive layers 8A and 8B insulated from each other sandwiching the insulating layer 7. The magnetoresistive devices 12A and 12B are formed on the top face of the conductive layer 8 and the insulating layer 7 and positioned so that at least part of the formation areas of the magnetoresistive devices 12A and 12B overlap with the formation areas of the conductive layers 8A and 8B. Therefore, the magnetoresistive devices 12A and 12B are joined to the conductive layers 8A and 8B insulated from each other, respectively, and are electrically insulated from each other. That is, wiring is conducted so that the magnetoresistive devices 12A and 12B are electrically non-conductive.

The substrate 10 takes the form of an n-type silicon wafer. Generally, the n-type silicon wafer is doped with impurity of P (phosphorus). As the substrate 10, a substrate of the $n^{++}$ type obtained by high-concentration doping of P (phosphorus) is used. On the other hand, as the epitaxial layer 9, a substrate of the $n^-$ type obtained by low-concentration doping of P (phosphorus) is used. The conductive layer 8 is made of a metal. When the epitaxial layer 9 as an $n^-$ type semiconductor and the metal conductive layer 8 come into contact with each other, a bandgap occurs and a Schottky diode is formed. This is how the diodes 13A and 13B in the embodiment are formed.

By forming the diodes 13A and 13B as Schottky diodes, advantages such that a silicon wafer with an epitaxial layer can be easily obtained at low price and the forming process is easy are obtained. However, leak current of the Schottky diode is larger than that of a PN junction diode by hundreds times or more. In addition, increase in the leak current in association with temperature rise is also large. In the case where the magnetic memory device takes the form of an MRAM semiconductor memory chip and thousands of Schottky diodes are connected in parallel with the storage cells 12, leak current increases considerably and it may deteriorate the S/N ratio of a read output. Although Schottky diodes having advantages from the viewpoint of cost and manufacture are employed here as the diodes 13A and 13B, in the case such that leak current is not ignorable, as the diodes 13A and 13B, a PN junction diode, a BJT whose base and collector are short-circuited, or a MOSFET whose gate and drain are short-circuited may be used.

Figure 9:
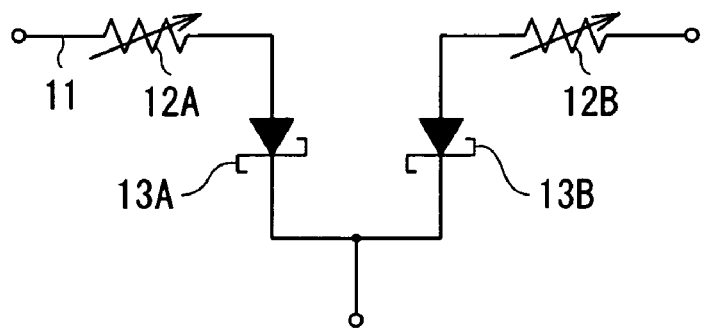
FIG. 9 is a diagram showing an equivalent circuit of the storage cell illustrated in FIG. 7.

FIG. 9 is a circuit diagram of the storage cell. The pair of magnetoresistive devices 12A and 12B is regarded as variable resistors since the value of current flowing changes in accordance with a relative angle between the magnetization directions of the first and second magnetic layers 1 and 3. That is, the magnetoresistive device 12A (12B) has a low-resistance state where current density of tunnel current which can be passed is high and a high-resistance state where the current density is low.

As will be described in detail in the following description of operation, in the embodiment, one of the magnetoresistive devices 12A and 12B is set to the low-resistance state and the other magnetoresistive device is set to the high-resistance state to store information. The arrangement is directed to amplify the difference between outputs from the two magnetoresistive devices 12A and 12B and read it. Therefore, the two magnetoresistive devices 12A and 12B in a pair have to be manufactured so as to have the same resistance value and the same magnetoresistive change rate and the same magnitude of the reverse magnetic field of the second magnetic layer 3.

Writing Operation on Storage Cell

An information storing method and a writing operation method on the storage cell 12 will now be described.

Figure 10A:
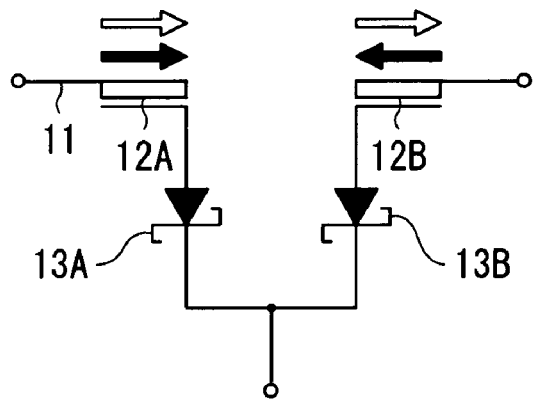
FIGS. 10A and 10B are diagrams for explaining a method of storing information in the storage cell illustrated in FIG. 7.
Figure 10B:
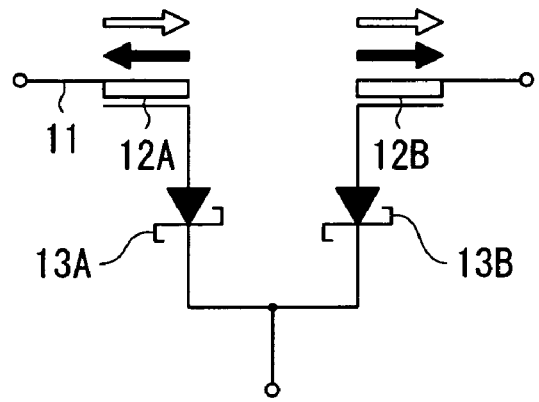

FIGS. 10A and 10B show the storage cell in a manner similar to FIG. 9 and the magnetization directions of the first and second magnetic layers 1 and 3 in each of the magnetoresistive devices 12A and 12B. In FIGS. 10A and 10B, blank arrows indicate the magnetization direction of the first magnetic layer 1, which is pinned to the rightward direction in both of the magnetoresistive devices 12A and 12B. On the other hand, painted arrows indicate the magnetization direction of the second magnetic layer 3. The second magnetic layers 3 in the magnetoresistive devices 12A and 12B are magnetized in anti-parallel with each other. As described above, information is stored in the storage cell 12 in a state where the magnetization directions of the second magnetic layers 3 in the pair of magnetoresistive devices 12A and 12B are anti-parallel with each other.

In each of the magnetoresistive devices 12A and 12B in a pair, the combination of the magnetization directions of the first and second magnetic layers 1 and 3 is always in a first state of "parallel, anti-parallel" or a second state of "anti-parallel, parallel". Therefore, by making binary information of "0" and "1" correspond to the two states, information of one bit is stored in a single storage cell 12. In the magnetoresistive device 12A (12B), when the magnetization directions of the first and second magnetic layers 1 and 3 are parallel with each other, the low-resistance state in which large tunnel current flows is obtained. When they are anti-parallel with each other, the high-resistance state in which only small tunnel current flows is obtained. That is, one of the magnetoresistive devices 12A and 12B in a pair is always set in the low-resistance state and the other device is always set in the high-resistance state, thereby storing information.

Figure 11:
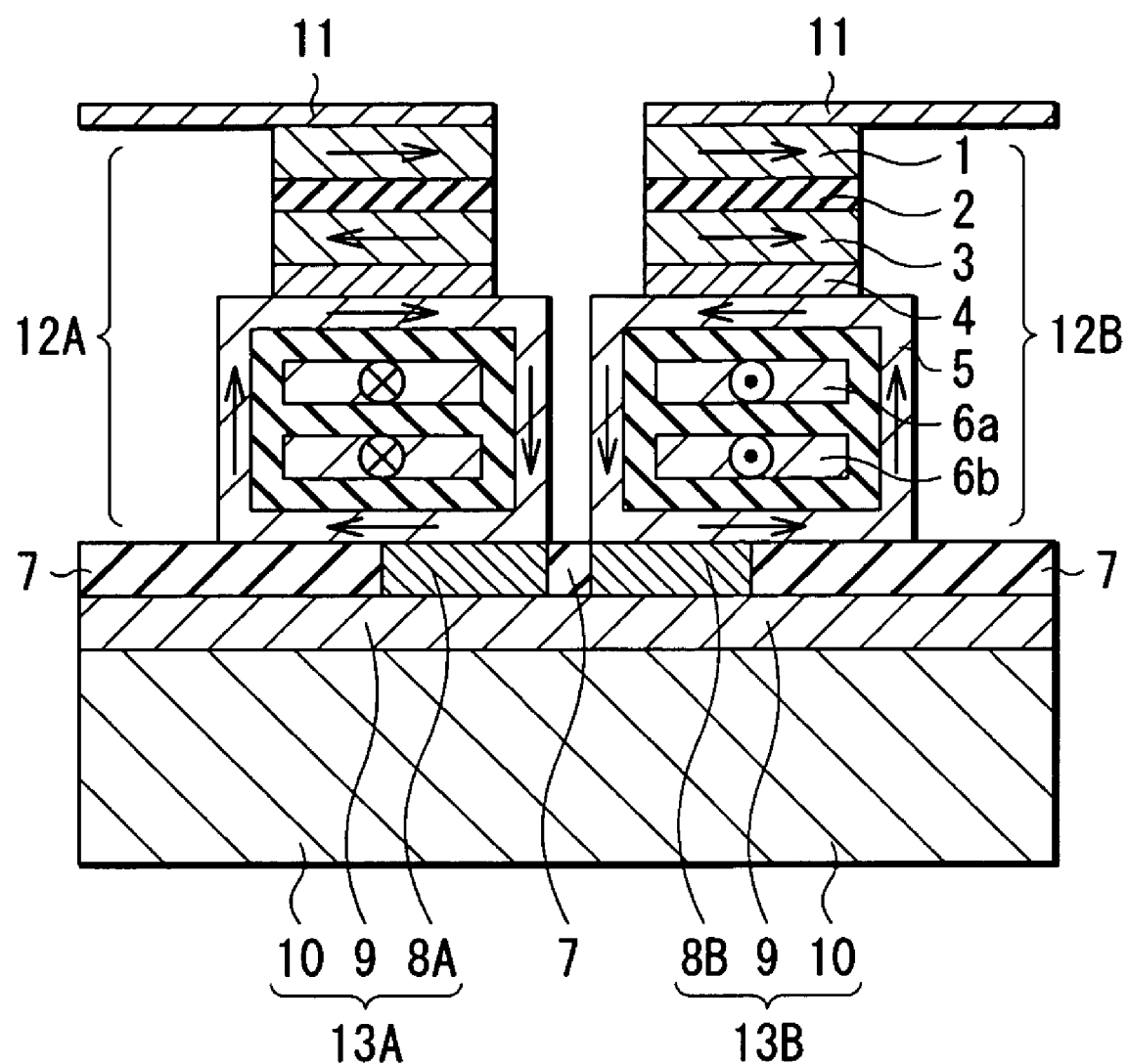
FIG. 11 is a diagram for explaining a method of writing information in the storage cell illustrated in FIG. 7.

To make the magnetization directions of the second magnetic layers 3 in the magnetoresistive devices 12A and 12B in a pair anti-parallel with each other, as shown in FIG. 11, current is passed so as to be relatively in opposite directions to the write bit line 6a and the write word line 6b in the magnetoresistive devices 12A and 12B (refer to FIG. 8). FIG. 11 shows the directions of write currents in the case of writing the bit "1" shown in FIGS. 10A and 10B to the storage cell 12.

Consequently, the magnetic fields circulated in opposite directions are induced to the toroidal magnetic layers 5 in the magnetoresistive devices 12A and 12B, and the magnetization directions (that is, the directions of the induction fields) in the surfaces facing the second magnetic layers 3 are anti-parallel with each other. The magnetization directions of the second magnetic layers 3 of the magnetoresistive devices 12A and 12B become anti-parallel with each other in accordance with the directions of the magnetic fields supplied from the outside, and the magnetization state is pinned by anti-ferromagnetic coupling to the toroidal magnetic layer 5. To write the bit "0", the directions of currents passed to the magnetoresistive devices 12A and 12B are switched opposite to the directions shown in the diagram.

Since the induction field is confined in the toroidal magnetic layer 5, the effective magnetic field strength contributing to the magnetization reverse of the second magnetic layer 3 increases as compared with that in the conventional technique. As a result, the magnetization direction of the second magnetic layer 3 can be reversed with sufficient magnetic field strength, and efficient writing operation can be performed. In other words, in the writing operation, the magnetization directions of the second magnetic layer 3 are aligned so as to achieve sufficient strength in a predetermined direction. Therefore, the possibility that the magnetization direction of the second magnetic layer 3 is disturbed by an external disturbance magnetic field is reduced. Information once written can be prevented from being unexpectedly erased or rewritten. That is, information can be written with reliability.

In the magnetic memory device, first, the address buffer 101 receives signal voltages of the external address input terminals A0 to A20, amplifies them in the internal buffer, and transmits the resultant to the Y-direction and X-direction address decoders 106A and 108A via the address lines 105 and 107, respectively. Simultaneously, the data buffer 102 receives signal voltages of the external data terminals D0 to D7, amplifies them by the internal buffer, and transmits the resultant to the Y-direction and X-direction current drives 106C and 108C via the write data buses 110 and 111, respectively (FIG. 1).

By a selection signal, the address decoders 106A and 108A select the write bit line 6a and the write word line 6b having decode values corresponding to the selection signal. The directions of current passed to the write bit line 6a and the write word line 6b are determined by the current drives 106C and 108C. As a result, the storage cell 12 in which current is passed to both of the write bit line 6a and the write word line 6b is unconditionally selected, and predetermined bit data is written in the selected storage cell 12. For example, FIG. 8 shows a state where the directions of the currents to the write bit line 6a and the write word line 6b are indicated by the arrows and the storage cell 12 is selected.

Reading Operation

In the magnetic memory device, information written in each storage cell 12 is read as follows.

Basic Operation

Figure 12:
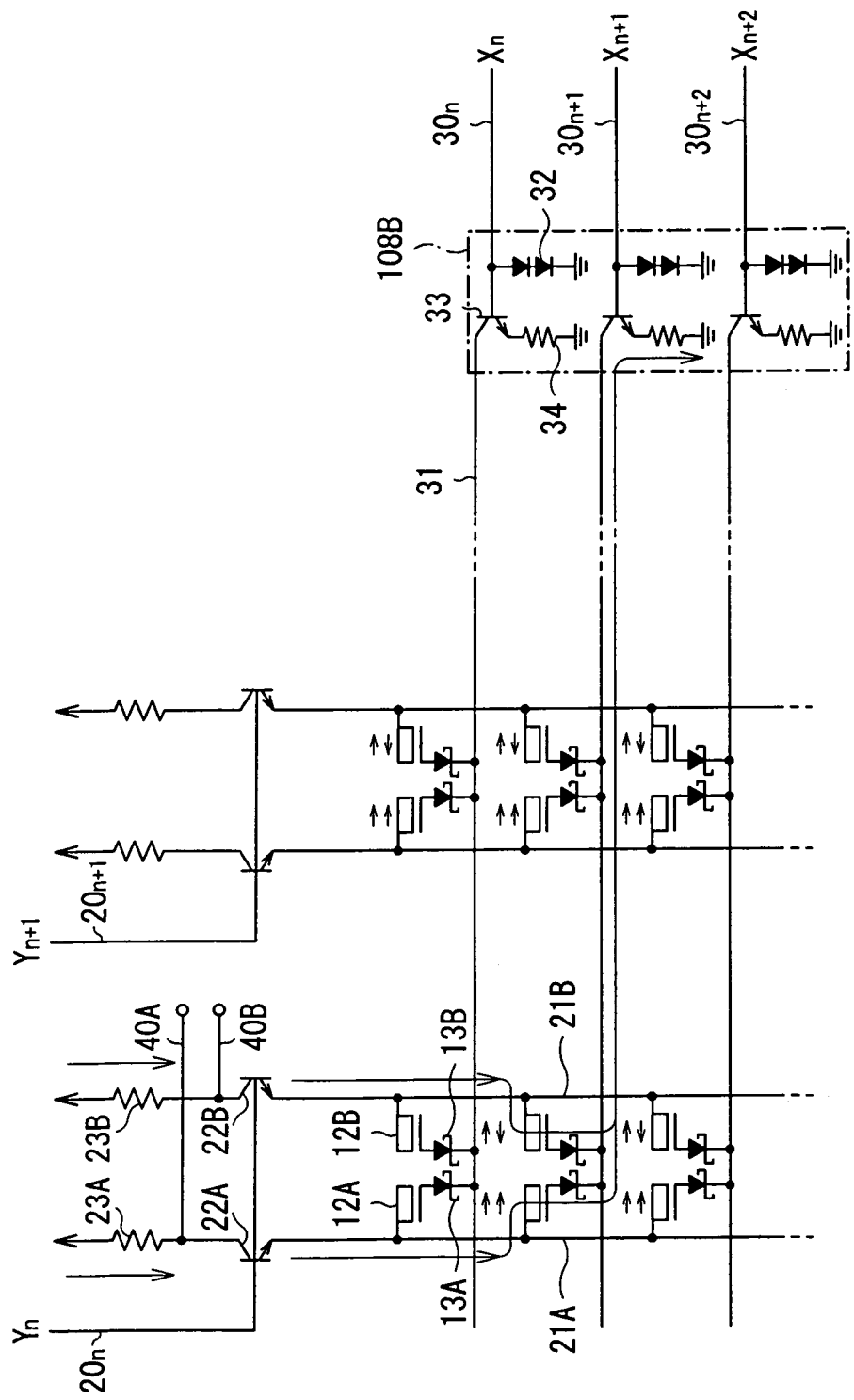
FIG. 12 is a diagram for explaining the principle of an operation of reading information from a storage cell in the magnetic memory device illustrated in FIG. 1.

FIG. 12 shows a basic configuration of a storage cell. First, referring to FIG. 12, a basic portion of the reading operation will be described. In the storage cells 12, the magnetization directions of the magnetoresistive devices 12A and 12B are as shown in the diagram and information is stored. Among them, a storage cell 12 from which information is to be read is selected by inputting a selection signal to the bit decode line 20 in the Y direction and the word decode line 30 in the X direction in correspondence with the address of the storage cell 12. For example, in the case where the storage cell 12 to be selected is positioned in the $Y_n$ column and the $X_{n+1}$ row, the signal is input to the $Y_n$-th bit decode line 20, and the $X_{n+1}$-th word decode line $30_{n+1}$.

When the voltage level in the $Y_n$-th bit decode line $20n$ is set to be "high", the transistors 22A and 22B become conductive, and sensing current flows in the $Y_n$-th column-direction blocks (bit line $Y_n$) in the storage cell 12. The sensing current flows downward through the sense bit lines 21A and 21B from the power source Vcc side to the opposite side.

On the other hand, when the voltage level in the $X_{n+1}$-th word decode line $30_{n+1}$ is set to be "high", the transistor 33 becomes conductive to allow current to flow into the $X_{n+1}$-th row-direction blocks (word line $X_{n+i}$) in the storage cell 12. Therefore, the sensing current flows from the $Y_n$-th sense bit lines 21A and 21B via the magnetoresistive device 12A, diode 13A, magnetoresistive device 12B, and diode 13B to the $X_{n+1}$-th sense word line 31. Further, the sensing current passes between the collector and emitter of the transistor 33 as a component of the constant current circuit 108B, and is passed from the current control resistor 34 to the ground. In such a manner, the storage cell 12 in the $Y_n$ column and the $X_{n+1}$ row is selected by passing the sensing current to the magnetoresistive devices 12A and 12B in the $Y_n$ column and the $X_{n+1}$ row.

Information is read by detecting the difference between values of currents flowing in the magnetoresistive devices 12A and 12B in the storage cell 12. The current flowing in the magnetoresistive devices 12A and 12B is almost equal to the sensing current flowing in the sense bit lines 21A and 21B. In the resistor 23A (23B) connected to the sense bit line 21A (21B) in series, a voltage drop Va due to the sensing current occurs. The voltage drop Va is determined by Formula 1 when the magnitude of the sensing current is Isense and the resistance value of the resistor 23A (23B) is Ra.

$$Va(\text{volt}) = Isense(A) \times Ra(\Omega) \quad \text{Formula 1}$$

From Formula 1, it is understood that when the value of the resistor 23A and that of the resistor 23B are identical, the sensing current Isense can be converted to a voltage by the voltage drop Va and sensed. As read output signals, voltage drops in the resistors 23A and 23B are taken from the input lines 40A and 40B, and the difference between the voltage drops is detected. As described above, by obtaining the difference between the output values by using the two magnetoresistive devices 12A and 12B, a large output value from which noise is removed is obtained from the storage cell 12.

Action of Constant Current Circuit 108B

In the reading operation, the magnitude of the sensing current flowing in the selected storage cell 12 is adjusted by the current control resistor 34 provided on the ground side of the sense word line 31. The current control register 34 produces an effect of regulating the current amount by itself. Further, the constant current circuit 108B constructed by combining the current control resistor 34, transistor 33, and diode 32 operates so that the current amount lies in a predetermined range.

When the voltage level of the word decode line 30 is "high", the two diodes 32 connected in series fixedly produce an intermediate voltage level higher than the ground only by +2Φ by using a bandgap reference of the diodes. Therefore, the intermediate voltage level is applied to the base terminal of the transistor 33, and the transistor 33 enters an energized state. At this time, when the resistance value of the current control resistor 34 is set as Rc, the magnitude Isense of the sensing current flowing from the sense word line 31 is obtained by Formula 2.

$$Isense(A) = (2\phi' - \phi'')(\text{Volt})/Rc(\Omega) \quad \text{Formula 2}$$

where $2\phi'$ denotes a forward voltage of the two diodes 32 connected in series, and $\phi''$ denotes a forward voltage between the base and emitter of the transistor 33. Since those values are values peculiar to the semiconductor device, Formula 2 shows that when the resistance value Rc is determined, the sensing current Isense has a constant value and is unconditionally determined by using the resistance value Rc as a parameter.

That is, because of the constant current circuit 108B, the weak sensing current Isense stably flows within a predetermined range in the sense word line 31. The sensing current Isense in Formula 2 is a current flowing in the sense word line 31 and is a sum of the currents flowing in the sense bit lines 21A and 21B or the magnetoresistive devices 12A and 12B.

As an example, when the resistance value of the current control resistor 34 is set to 50 kΩ and a silicon diode and a silicon transistor are used as the diode 32 and the transistor 33, respectively, the sensing current Isense by the constant current circuit 108B becomes about 15 μA. In this case, even if the ranges of the resistance values which are possible in drive operation of the paired magnetoresistive devices 12A and 12B are different from each other for some reasons in manufacture, the sum of the currents flowing in both of the magnetoresistive devices 12A and 12B is always equal to almost 15 μA. Variations in the resistance values of the magnetoresistive device 12A (12B) caused in manufacture denote that since the nonmagnetic layer 2 has only a thickness of a few atomic units such as a few nm (tens A), the resistance value changes only by slight variations in the thickness and the atomic arrangement. Consequently, although close attention is paid to form the nonmagnetic layer 2 with uniform thickness, in reality, variations of about 15 to 50%, or more when conditions such as manufacturing facility are bad, occur in the resistance value of the magnetoresistive device 12A (12B).

There are two cases where the resistance values of the magnetoresistive devices 12A and 12B vary due to different causes. (1) In the first case, the resistance value when the resistance of the magnetoresistive device 12A (12B) is low and that when the resistance of the magnetoresistive device 12A (12B) is high are different from each other due to variations in thickness of the nonmagnetic layer 2 or the like between the storage cells 12. Generally, when the thickness of the nonmagnetic layer 2 increases, the resistance values of the pair of magnetoresistive devices 12A and 12B increases in both of the low resistance state and the high resistance state. (2) In the second case, the ratio between a resistance value when a large tunnel current flows and a resistance value when only a small tunnel current flows, that is, the MR ratio varies due to roughness of the junction interface, the difference in thickness between the nonmagnetic layers 2, and the other causes.

It is now assumed that (1) the resistance values of the magnetoresistive devices 12A and 12B vary among the storage cells 12. Although the values of currents flowing in the sense bit lines 21A and 21B are according to the resistance values of the magnetoresistive devices 12A and 12B in a pair, the sum is controlled to be always a constant value. In other words, each of the values of currents flowing in the sense bit lines 21A and 21B is obtained by dividing a normalized current amount in accordance with a resistance ratio. Consequently, variations in the current value can be suppressed in comparison with the degree of variation in the resistance value. Further, when variations in resistance among the storage cells 12 do no change each of MR ratios, the resistance ratios of the pair of the magnetoresistive devices 12A and 12B are equal to each other. Therefore, irrespective of the resistance values of the storage cells 12 (even if they largely differ from each other), the current values of the sense bit lines 21A and 21B are almost equal to each other. The difference between current values of the sense bit lines 21A and 21B is always put within a predetermined range. Consequently, the difference between voltage drops of the current voltage converting resistors 23A and 23B is put within a predetermined range, a stable differential output can be obtained, and the S/N ratio of a read signal can be improved.

On the other hand, as understood from the above description, (2) variations in the MR ratio, particularly, drop in the MR ratio between the magnetoresistive devices 12A and 12B are/is critical in the case of obtaining a differential output, and it extremely deteriorates the S/N ratio of an output signal. However, in this case, the constant current circuit 108B is provided, so that fluctuations in the currents in the sense bit lines 21A and 21B are suppressed according to a total current value. It also suppresses fluctuations in the voltage drops of the current voltage converting resistors 23A and 23B, and variations in the offset voltage in inputs of the sense amplifier 106B can be lessened. Therefore, also in this case, the S/N ratio of a read output signal can be improved.

Action of Backflow Prevention Diode

In the above-described reading operation, the diodes 13A and 13B provided on a current path on the side of the sense word line 31 of each of the magnetoresistive devices 12A and 12B prevent the current from flowing backward from the sense word line 31 to the magnetoresistive devices 12A and 12B.

Since the magnetoresistive devices 12A and 12B in the bit line $Y_n$ and the word line $X_n$ are connected to the common sense bit lines 21A and 21B and the common sense word line 31, there is the possibility that part of the sensing current goes out of the normal path and flows in another path via the magnetoresistive devices 12A and 12B which are not objects to be read, flows down to the ground, or comes back to the normal path. Such a wiring structure is employed also for simplifying the wiring by making a single selection switch of the storage cell 12 shared in a line in each of the bit and word directions but, in this case, for making the constant current circuit 108B shared by a column.

A component of current flowing out of the normal path and flowing in the circuit, particularly, a component of current flowing out of the normal path and coming back to the normal path exists on a backflow path of the magnetoresistive device 12A (12B). The path is, however, interrupted by the diodes 13A and 13B as one-way devices.

Figure 13:
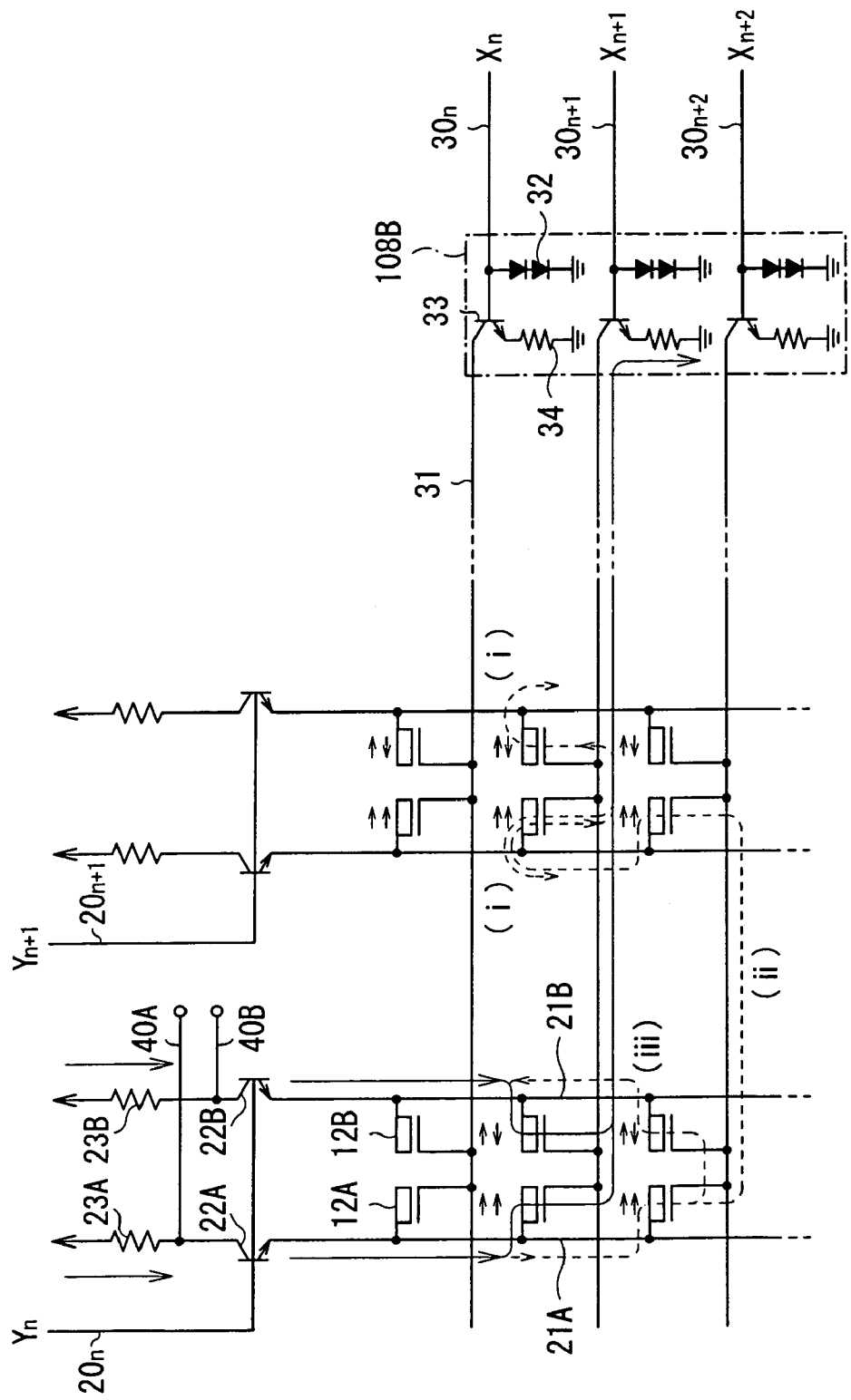
FIG. 13 is a circuit diagram showing a comparative example of the read circuit illustrated in FIG. 2.

FIG. 13 shows, as a comparative example of the embodiment, a path (i) of a leak current and paths (ii) and (iii) of current which goes out from the normal path and comes back to the normal path in the case where the diodes 13A and 13B do not exist on the current paths of the magnetoresistive devices 12A and 12B. In the diagram, the storage cell 12 in the bit line $Y_n$ and the word line $X_{n+1}$ is the cell from which information is being read. That is, the current path indicated by the solid line is a normal current path.

On the other hand, for example, as shown by the path (i), part of the sensing current flows backward from the sense word line 31 to the magnetoresistive devices 12A and 12B neighboring in the word line direction and, further, flows into the sense bit line $20_{n+1}$. A similar leak occurs also in a number of magnetoresistive devices 12A and 12B (not shown) commonly connected to the same sense word line 31.

For example, as shown in the path (ii), a path which goes round the low-resistance side magnetoresistive device 12A (12B) in the storage cell 12 exists. In the diagram, paths are drawn by using the magnetoresistive device 12A in all of the storage cells 12 as the low resistance side. In this case, the current flows the sense bit line 21A downward, passes through the low-resistance-side magnetoresistive device 12A neighboring in the bit line direction and, via the sense word line 31, flows backward to the low-resistance-side magnetoresistive device 12A in the storage cell 12 neighboring in the word line direction. After that, the current flows through the sense bit line 21A which is out of the normal path to the magnetoresistive device 12A (neighboring in the bit line direction in the diagram) connected to the selected sense word line 31, flows in the low-resistance-side magnetoresistive device 12A and, finally, flows in the selected sense word line 31. Similar roundabout also occurs in a number of magnetoresistive devices 12A (not shown) connected to the same sense bit line 21A and also in a number of magnetoresistive devices 12A and 12B (not shown) sharing the sense word line 31 connected to the magnetoresistive devices 12A. The roundabout similarly occurs also in the case where the magnetoresistive device 12B is in a low resistance state.

Another example of roundabout is a path (iii). In this case, current flows backward in one of the magnetoresistive device 12A or 12B by flowing from the magnetoresistive device 12A (low-resistance side) connected to the same sense bit line 21A to the magnetoresistive device 12B (high-resistance side), thereby passing one storage cell 12. Further, the current flows upward through the sense bit line 21B on the opposite side and flows back from the magnetoresistive device 12B of the storage cell 12 to be read to the normal path.

All of the paths (i) to (iii) can be interrupted by providing the diodes 13A and 13B on the current path of the magnetoresistive devices 12A and 12B. In such a manner, fluctuations in the sensing current, that is, noise in a signal which are/is caused by leakage or roundabout of current via the magnetoresistive devices 12A and 12B can be reduced. Also in the case of connecting the current paths of the magnetoresistive devices 12A and 12B of each storage cell 12 to one diode, the paths (i) and (ii) can be interrupted, and a certain effect on the leakage or roundabout of current is expected. To interrupt the path (iii), the magnetoresistive devices 12A and 12B in the storage cell 12 are made nonconductive as in the embodiment, and backflow has to be prevented in the magnetoresistive devices 12A and 12B independently of each other.

Modification of Backflow Prevention Diode

Figure 14:
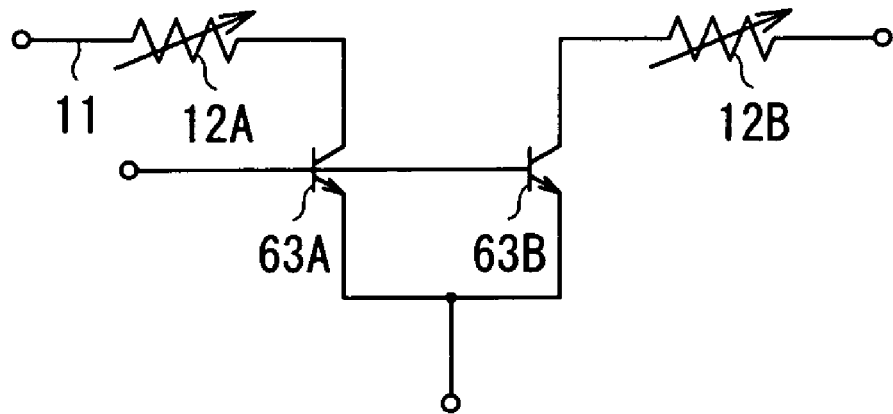
FIG. 14 is a diagram showing a rectifier and its layout in a modification of a backflow prevention diode in the read circuit illustrated in FIG. 2.

The diodes 13A and 13B in the embodiment can be replaced with transistors as devices similarly having a rectifying action. FIG. 14 shows, as a modification, a case where bipolar transistors 63A and 63B are provided between the magnetoresistive devices 12A and 12B and the sense word line 31. When the base terminal is connected to the bit decode line 20 or word decode line 30, the bipolar transistors 63A and 63B can be made conductive interlockingly with the sense bit lines 21A and 21B or sense word line 31. In such a case, the transistors 22A and 22B are unnecessary. The bipolar transistors 63A and 63B similarly function as one-way devices.

The advantage of using the bipolar transistors 63A and 63B is that a voltage in the conductive state is much lower than the forward voltage of the diode. Although a collector-emitter voltage when the transistor is conductive is very low (about 0.2V), a voltage of the bandgap Φ (0.65V to 0.75V) is applied as a forward voltage to the diode. In the read circuit of the embodiment, the current path has a five-stage configuration, in series from the power source Vcc to the ground, of the current voltage converting resistor 23A (23B), transistor 22A (22B), magnetoresistive device 12A (12B), diode 13A (13B), transistor 33, and current control resistor 34. Consequently, voltage distribution has to be considered. The bipolar transistors 63A and 63B can operate on a power source voltage lower than that of the diodes 13A and 13B by about 0.5V. By increasing the number of stages of the circuit by a few stages and using the residual amount of the voltage for the increased stages, a more complicated control operation can be performed.

Figure 15:
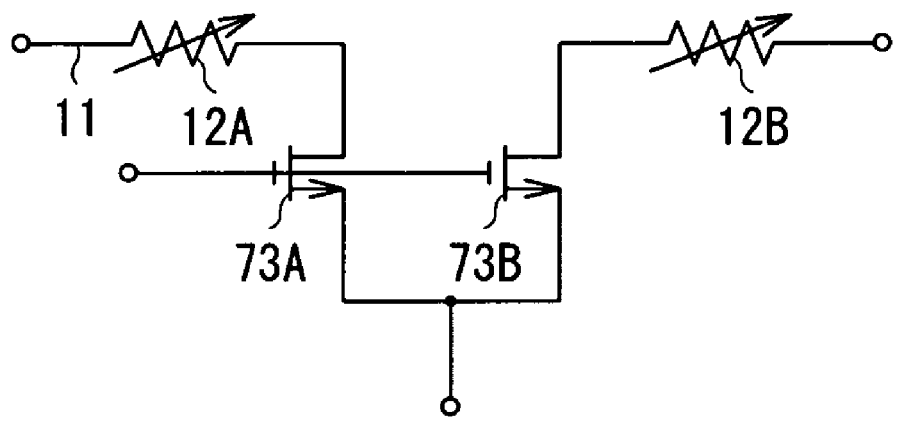
FIG. 15 is a diagram showing a layout in a modification of the backflow prevention diode in the read circuit illustrated in FIG. 2.

The diodes 13A and 13B may be also replaced with MOS transistors 73A and 73B as shown in FIG. 15. In this case, the drain-source voltage in a conductive state is considerably low as about 0.1V, and an effect of using the MOS transistors 73A and 74B is similar to that of the case of using the bipolar transistors 63A and 63B.

Figure 16:
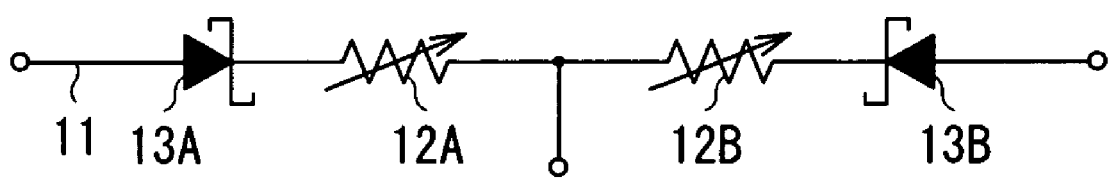
FIG. 16 is a diagram showing a rectifier and its layout in a modification of the backflow prevention diode in the read circuit illustrated in FIG. 2.
Figure 17:
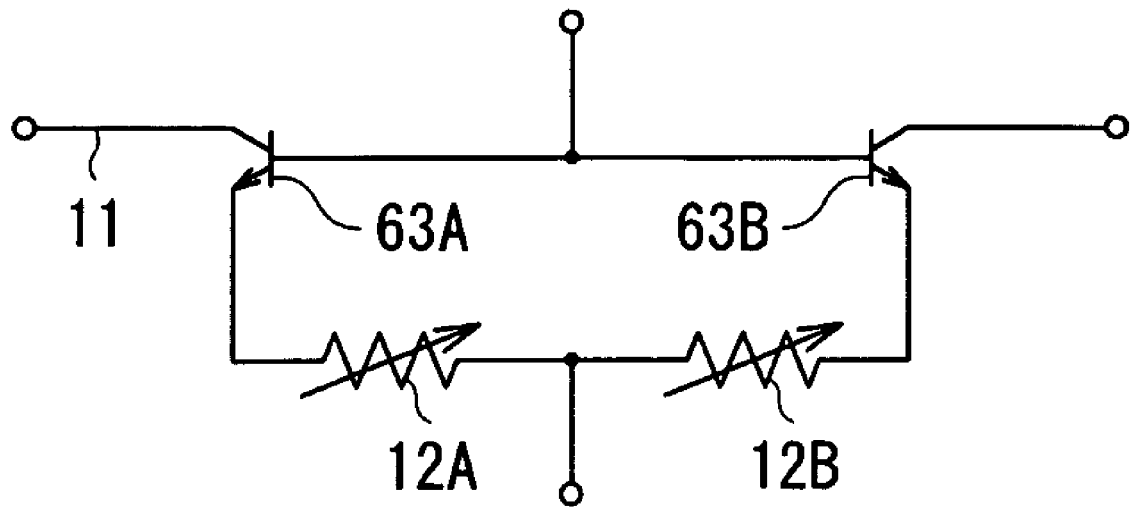
FIG. 17 is a diagram showing a rectifier and its layout in a modification of the backflow prevention diode in the read circuit illustrated in FIG. 2.
Figure 18:
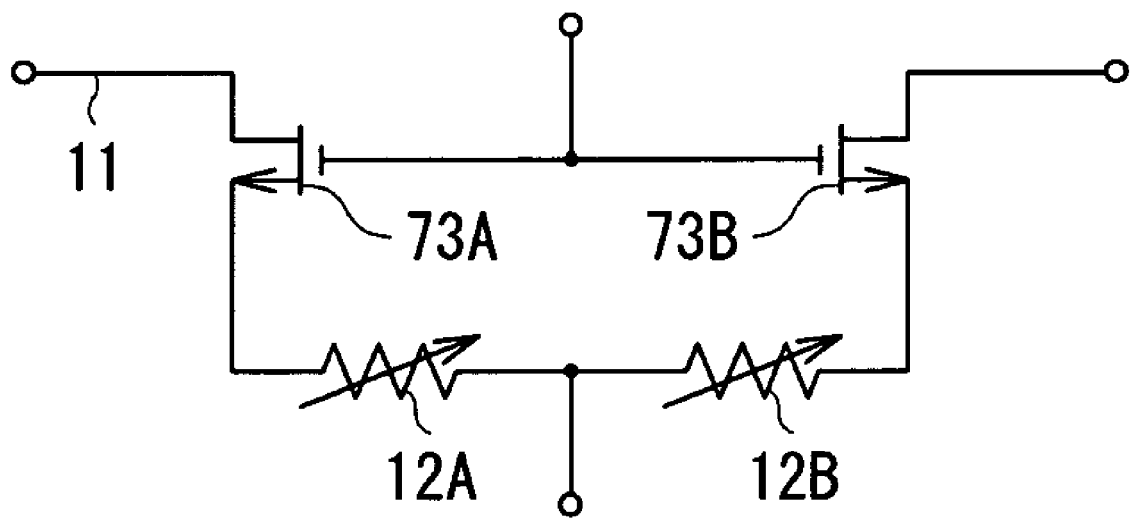
FIG. 18 is a diagram showing a rectifier and its layout in a modification of the backflow prevention diode in the read circuit illustrated in FIG. 2.

The rectifiers may be provided between the sense bit lines 21A and 21B and the magnetoresistive devices 12A and 12B as shown in FIGS. 16 to 18.

Signal Output Operation at the Post Stage of Sense Amplifier

Further, by amplifying the potential difference obtained from the input lines 40A and 40B by the sense amplifier 106B (FIG. 2), an output having a larger value and an excellent S/N ratio can be obtained. To the output lines 51A and 51B, a number of sense amplifiers 106B of the bit-direction unit readout circuits 80 ( . . . , $80_n$, $80_{n+1}$, . . . ) are cascaded on the collector side. By making the transistor 44 conductive upon selection of one of the plurality of bit decode lines 20, corresponding one sense amplifier 106B becomes active and only the collector output of the activated sense amplifier 106B is transmitted to the output lines 51A and 51B.

In this case, since the transistors 22A and 22B, resistors 23A and 23B, and sense amplifier 106B are integrated in an area having the same width W as that of the storage cell 12, the devices in differential pairs among the devices have almost the same temperature change in operation. Thus, fluctuations in output values caused by a temperature change are suppressed.

An output of the sense amplifier 106B passes through the output lines 51A and 51B and the read data bus 112 and is finally input to the output buffer 102B. The output buffer 102B amplifies the input signal voltage and outputs the resultant as a binary voltage signal from the external data terminals D0 to D7.

As described above, in the embodiment, each of the magnetoresistive devices 12A and 12B has the toroidal magnetic layer 5, so that writing can be performed efficiently and information can be written with reliability by making the magnetization directions of the second magnetic layers 3 sufficiently aligned. In the case of reading information, when the magnetization directions of the second magnetic layers 3 are sufficiently aligned in a predetermined direction, by the magnetization direction relative to that of the first magnetic layer 1, the tunnel current value in the magnetoresistive device 12A (12B) clearly shows a binary state. Consequently, an output value of a high S/N ratio can be obtained.

In addition, in the embodiment, the storage cell 12 is constructed by a pair of magnetoresistive devices 12A and 12B and currents flowing in the magnetoresistive devices 12A and 12B are output differentially, so that noise connected to the sense bit lines 21A and 21B is removed. Moreover, the constant current circuit 108B is provided on the ground side of the sense word line 31 to make the sum of sensing currents flowing in the read circuit maintained constant. Therefore, the difference between current values of the sense bit lines 21A and 21B is always put within a predetermined range irrespective of variations of the characteristics of the storage cells 12. Normalization of the total current value to a predetermined value produces an effect of suppressing fluctuations in the current values of the sense bit lines 21A and 21B irrespective of variations in resistance between the pair of magnetoresistive devices 12A and 12B. Thus, a stable differential output can be obtained and the S/N ratio of a read signal can be improved. Since the transistor 33 of the constant current circuit 108B functions also as a semiconductor switch for the word decode line 30, the manufacture is relatively easy and there is also an advantage from the viewpoint of circuit design.

Since the diodes 13A and 13B are provided as one-way devices between the magnetoresistive devices 12A and 12B and the sense word lines 31, backflow of current from the sense word line 31 to the magnetoresistive devices 12A and 12B is prevented. Consequently, a current path can be prevented from being formed between the storage cells 12 connected to the common sense bit lines 21A and 21B or common sense word line 31 and between the magnetoresistive devices 12A and 12B in a single storage cell 12. Since leakage and roundabout of the sensing current is suppressed, noise can be reduced.

Further, in the embodiment, the transistors 22A and 22B, resistors 23A and 23B, and sense amplifier 106B are integrated in the circuit area of the sense amplifier 106B, the pairs of circuit elements constructing a differential amplifier in cooperation with the sense amplifier 106B are formed in position close to each other. The circuit elements are therefore driven under similar temperature conditions, so that variations in characteristic caused by a temperature change are suppressed and noise in the differential amplifier can be prevented.

As described above, in the read circuit in the magnetic memory device of the embodiment, noise caused by variations in characteristics among the storage cells 12 and noise caused by variations in resistances in the pair of magnetoresistive devices 12A and 12B are suppressed. In addition, noise connected to the data line, noise caused by variations in characteristics of the sense amplifier 106B and other differential pairs, and noise of peripheral circuits to which current goes round from the power source circuit are suppressed. Thus, the S/N ratio of a read signal output can be largely improved. Therefore, the magnetic memory device can perform a stable operation with little read error. By the improvement in the S/N ratio, a large signal output value can be obtained. Therefore, also in the case of forming the storage cells 12 at high packing density, a sufficiently large output can be obtained. On the other hand, driving with low current and low voltage can be also realized.

Generally, in a magnetic memory device, to prevent occurrence of dielectric breakdown in a very thin tunnel barrier layer, it is necessary to set a voltage applied to a magnetoresistive device to a proper value when tunnel current is passed to the device. The magnetic memory device of the embodiment is provided with the constant current circuit 108B and, therefore, can be driven with reduced tunnel current and a voltage to be applied to the nonmagnetic layer 2, which is decreased to a voltage sufficiently lower than its electric withstand voltage. In the read circuit of the embodiment, the current path has a five-stage configuration, in series from the power source Vcc to the ground, of the resistor 23A (23B), transistor 22A (22B), magnetoresistive device 12A (12B), diode 13A (13B), transistor 33, and current control resistor 34. From the relation of voltage dividing, a voltage drop in the magnetoresistive device 12A (12B) can be suppressed to about 0.1V to 0.3V. Obviously, a voltage output (voltage drop in the resistors 23A and 23B) directly obtained from the magnetoresistive devices 12A and 12B in this case is weak, but the S/N ratio obtained by the effect of setting the sensing current to the constant current is high. Since the output is amplified by differential amplifiers in a few stages to obtain a final output, sufficiently high reading sensitivity can be obtained. That is, the magnetic memory device can be driven with tunnel current much weaker than that in the conventional technique, can prevent occurrence of dielectric breakdown of the magnetoresistive devices 12A and 12B, and can obtain a signal output having a sufficiently large value and an excellent S/N ratio.

Verification of Amplification Degree of Sense Amplifier

Figure 19:
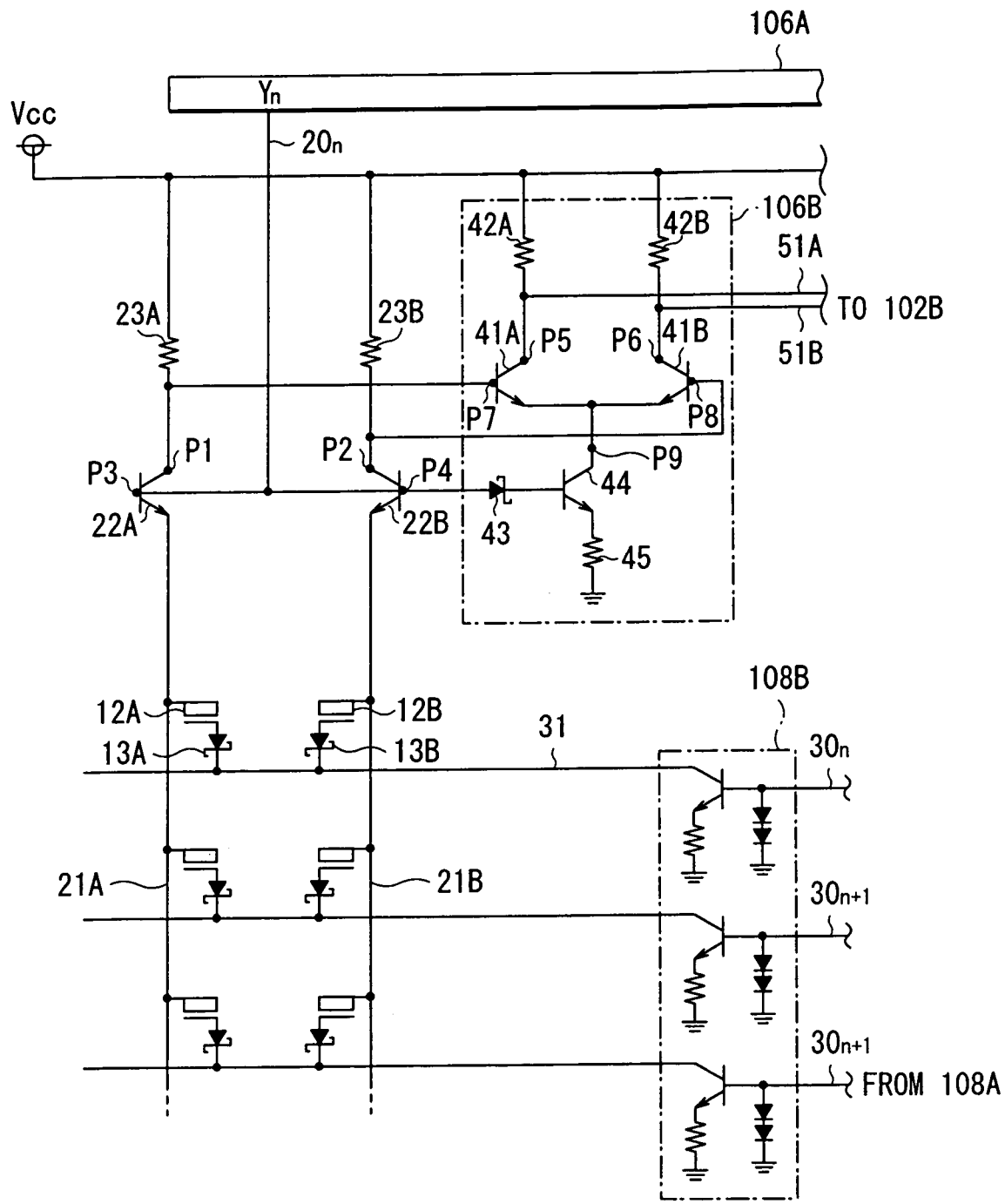
FIG. 19 is a diagram showing a read circuit in an embodiment of the magnetic memory device of the invention.

In an actual circuit (refer to FIG. 2) similar to the circuit of the embodiment, current values at measurement points were measured by using a current probe during reading of information. The measurement points are nine points P1 to P9 shown in FIG. 19 as follows.

Measurement point P1 . . . collector terminal of the transistor 22A

Measurement point P2 . . . collector terminal of the transistor 22B

Measurement point P3 . . . base terminal of the transistor 22A

Measurement point P4 . . . base terminal of the transistor 22B

Measurement point P5 . . . collector terminal of the transistor 41A

Measurement point P6 . . . collector terminal of the transistor 41B

Measurement point P7 . . . base terminal of the transistor 41A

Measurement point P8 . . . base terminal of the transistor 41B

Measurement point P9 . . . collector terminal of the transistor 44

The current values were measured while changing the value of a bit decode voltage applied to the bit decode line 20.

Figure 20:
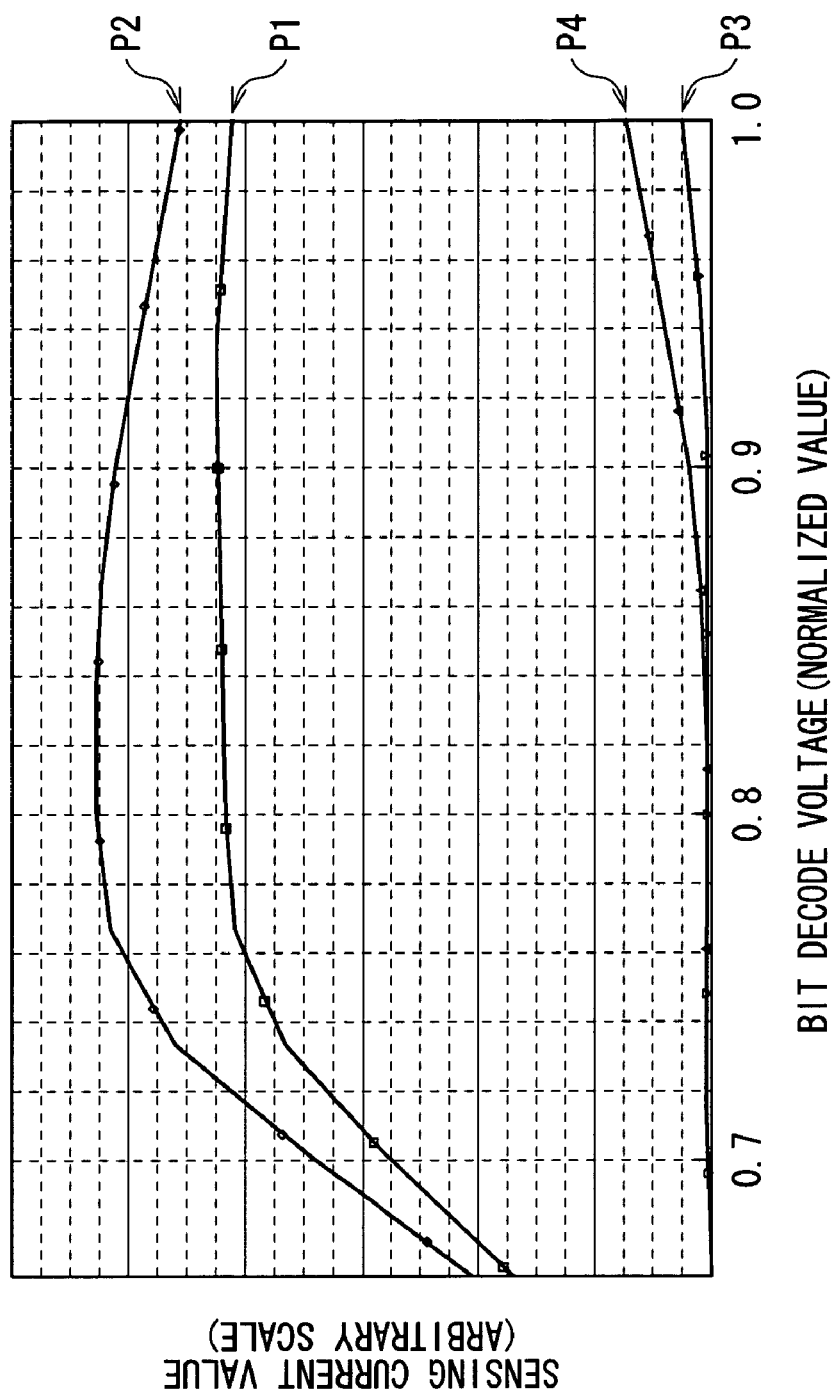
FIG. 20 is a diagram showing the relation between a bit decode voltage in the read circuit illustrated in FIG. 19 and current measurement values at measurement points P1 to P4.

FIG. 20 shows a measurement result of the measurement points P1 to P4. In the actual circuit, current flowing in the sense bit line 21A on the side connected to the magnetoresistive device 12A is the emitter current of the transistor 22A, that is, the sum of the collector current and the base current of the transistor 22A. It is understood from the measurement result that the collector current at the measurement point P1 is large to the degree that the base current of the measurement point P3 can be ignored. It is therefore understood that current flowing at the collector end and that at the emitter end of the transistor 22A are almost equal to each other. The relation between the collector current at the measurement point P2 for the transistor 22B and the base current at the measurement point P4 is similar to the above, and it is understood that current flowing at the collector end and that at the emitter end of the transistor 22B are almost equal to each other.

Figure 21:
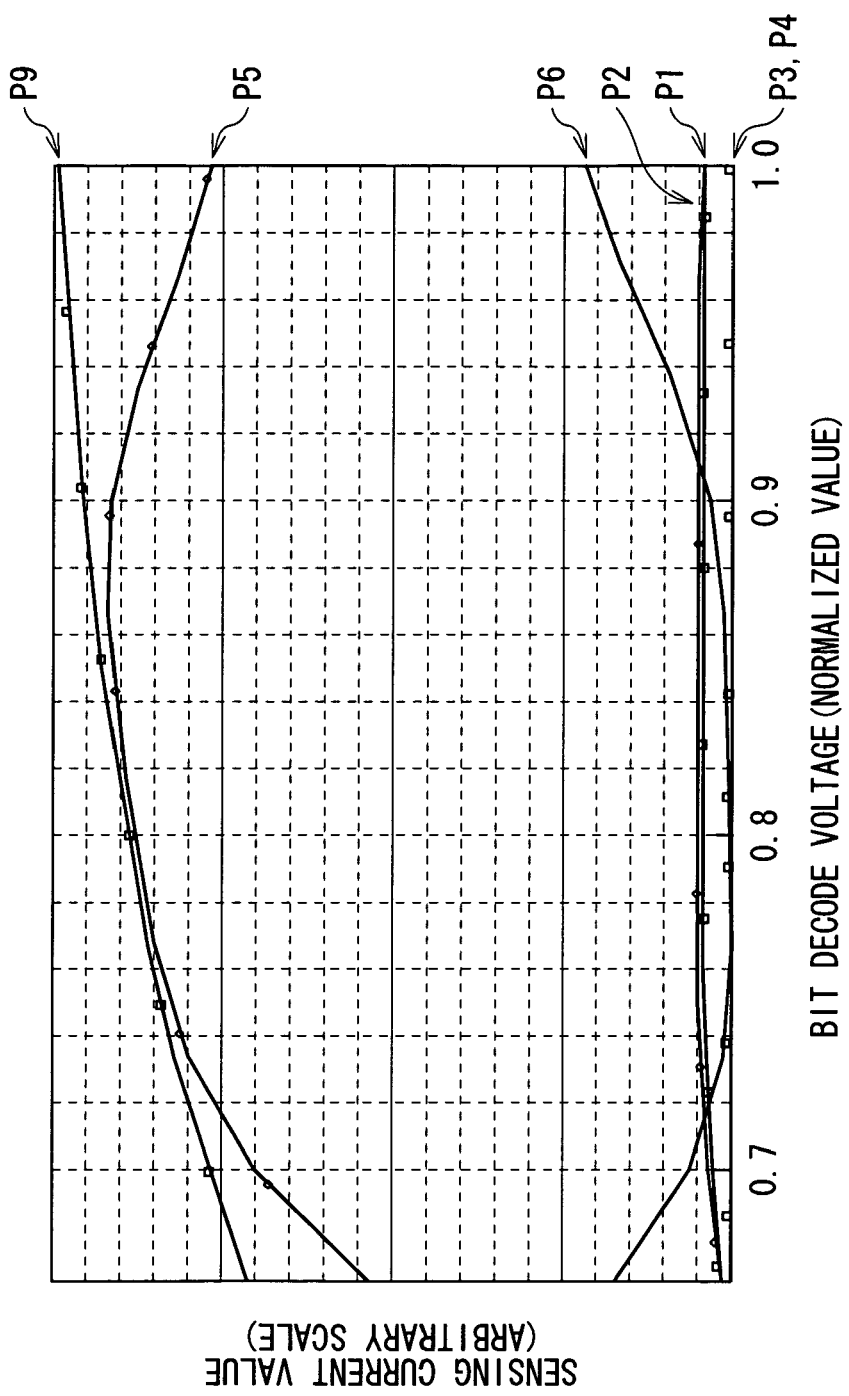
FIG. 21 is a diagram showing the relation between the bit decode voltage in the read circuit illustrated in FIG. 19 and current measurement values at measurement points P1 to P9.

FIG. 21 shows measurement results at the measurement points P1 to P9 (the scale of the current value of the vertical axis of FIG. 21 is different from that of FIG. 20). The current flowing to the resistors 23A and 23B is branched to the collector terminals of the transistors 22A and 22B as bit line selecting switches and the base terminals of the transistors 41A and 41B as a differential pair in the sense amplifier 106B. Further, the emitter currents, that is, the sum of the collector and base currents of the transistors 41A and 41B are combined by the common wire and flow into the collector terminal of the transistor 44.

The collector currents of the transistors 41A and 41B are obtained by amplifying the base currents (currents at the measurement points P7 and P8). From the measurement result, it is understood that the difference between the collector current of the transistor 41A at the measurement point P5 and the collector current of the transistor 41B at the measurement point P6 is much larger than the current difference between the sense bit lines 21A and 21B from which the current originally flows. The ratio of the current differences reaches about 200 times in the case of measurement data shown in the diagram. It is therefore understood that the magnetic memory device can obtain a very large output by amplifying a read signal by such a sense amplifier 106B.

It is understood from the measurement result that the base currents in the transistors 41A and 41B at the measurement points P7 and P8 are also very small, and it can be said that the current flowing in the resistors 23A and 23B is almost equal to that flowing in the collector terminals of the transistors 22A and 22B. Therefore, it could be confirmed that the sense amplifier 106B faithfully amplifies a current change in the magnetoresistive devices 12A and 12B in the read circuit.

Verification of Effects of Constant Current Circuit

Next, fluctuations in the read signal (voltage) with respect to the resistance variations in the magnetoresistive device 12A (12B) were examined in two ways in an actual circuit similar to the circuit of the embodiment.

Effects on Resistance Variations Among Storage Cells

First, a case where a resistance value ($R_L$) in a low resistance state and a resistance value ($R_H$) in a high resistance state of the magnetoresistive devices 12A and 12B vary among the storage cells 12 was examined. Specifically, output values of read voltages from the storage cells 12 whose resistance values $R_L$ and $R_H$ are different from each other were measured. In this case, the maximum resistance value and the minimum resistance value of each storage cell 12 are made different from each other by almost ten times but the MR ratio ($R_L/R_H$) in each storage cell 12 was fixed to 25%.

Figure 22:
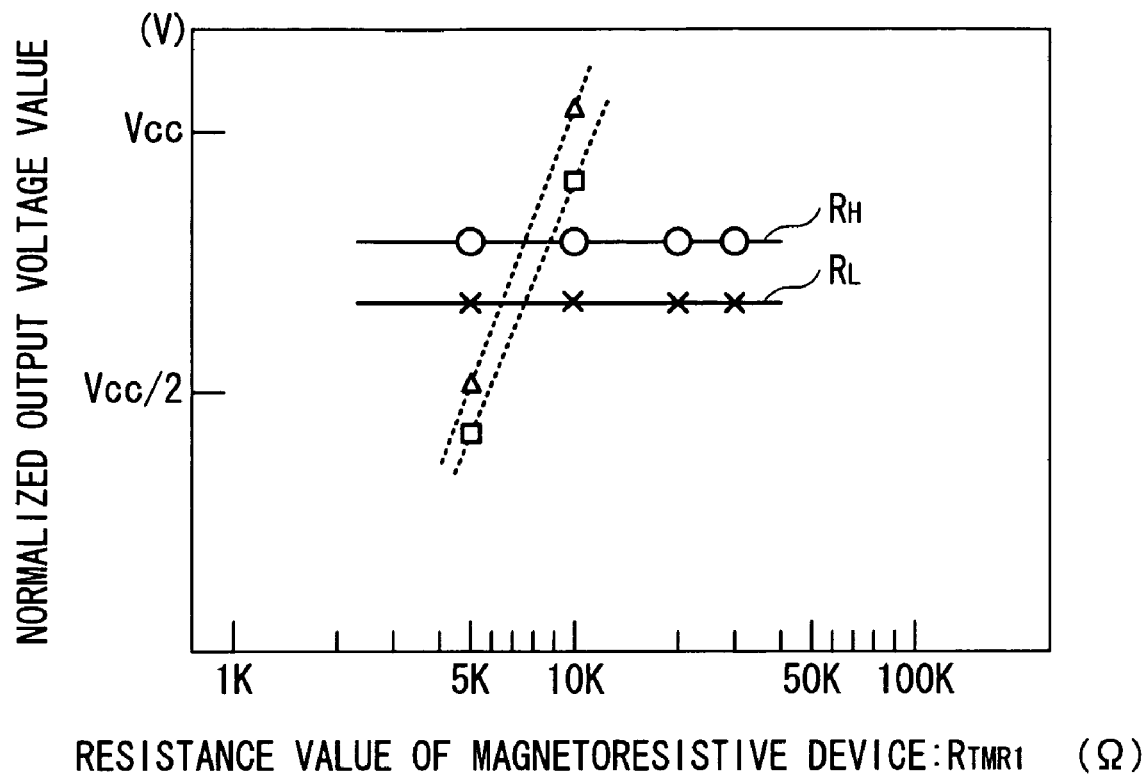
FIG. 22 is a diagram showing the relation between resistance fluctuations on a storage cell unit of a magnetoresistive device in the read circuit illustrated in FIG. 19 and an output voltage.

FIG. 22 shows the measurement result. The horizontal axis denotes a resistance value $R_{RMR1}$ of the magnetoresistive device, and the vertical axis denotes an output voltage value normalized with the power source voltage Vcc. In the diagram, each of blank circles indicates an output voltage value from the magnetoresistive device 12A (12B) when the resistance value $R_H$ in the high resistance state is employed, and each of x marks indicates an output voltage value from the magnetoresistive device 12B (12A) when the resistance value $R_L$ in the low resistance state is employed. Measurement values are connected by a solid line. Each of dotted lines indicates the result of a comparative example of passing current to a pair of magnetoresistive devices and directly sensing a voltage drop in the magnetoresistive devices.

It is clear from the results that even if the resistance values of the storage cells 12 are largely different from each other, each of an output voltage from the side of the resistance value $R_L$ and an output voltage from the side of the resistance value $R_H$ has an almost constant value. It is also confirmed that the final output voltage is always constant irrespective of variations in the resistance values of the storage cells 12. This is an effect of providing the constant current circuit 108B and normalizing the sum of currents flowing in the magnetoresistive devices 12A and 12B having the resistance values $R_L$ and $R_H$.

COMPARATIVE EXAMPLE

Figure 23:
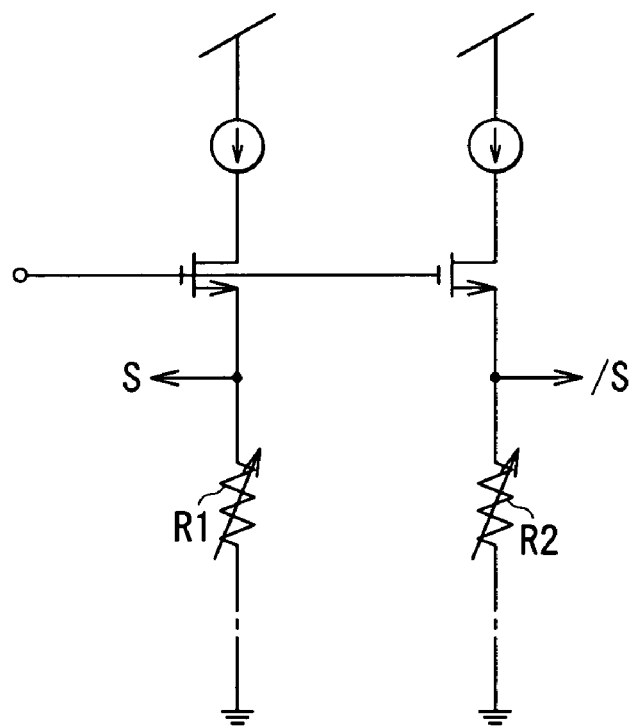
FIG. 23 is an equivalent circuit diagram for explaining a read circuit of a comparative example of the example shown in FIG. 22.

As a comparative example of the embodiment, measurement was similarly performed in a read circuit having a configuration in which current is passed to a pair of magnetoresistive devices and a voltage drop in the magnetoresistive devices is directly sensed. FIG. 23 is an equivalent circuit diagram of the comparative example. The read circuit employs a method of reading the difference between voltages of a pair of magnetoresistive devices (shown as variable resistors R1 and R2) one of which is in a high resistance state and the other is in a low resistance state, thereby storing information. Each of the pair of magnetoresistive devices is connected to a current source and a cell selection semiconductor switch in series. The serial wirings are independent of each other. In this case, voltage drops in the magnetoresistive devices are directly read as S and /S, so that a current voltage converting resistor is used. The measurement result is shown by the dotted lines in FIG. 22. As described above, in the circuit in which current to the magnetoresistive devices is set to be constant, output values largely vary in proportional to the resistance values of the magnetoresistive devices. Therefore, variations in resistance of the magnetoresistive devices directly exert an influence as fluctuations on the output values.

Effects on Variations in Resistance Among Magnetoresistive Devices

The case where the MR ratio varies between the magnetoresistive devices 12A and 12B paired in each storage cell 12 was examined. While changing the MR ratio of the storage cell 12 by fixing the resistance value $R_H$ and varying the resistance value $R_L$, output voltages were measured.

Figure 24:
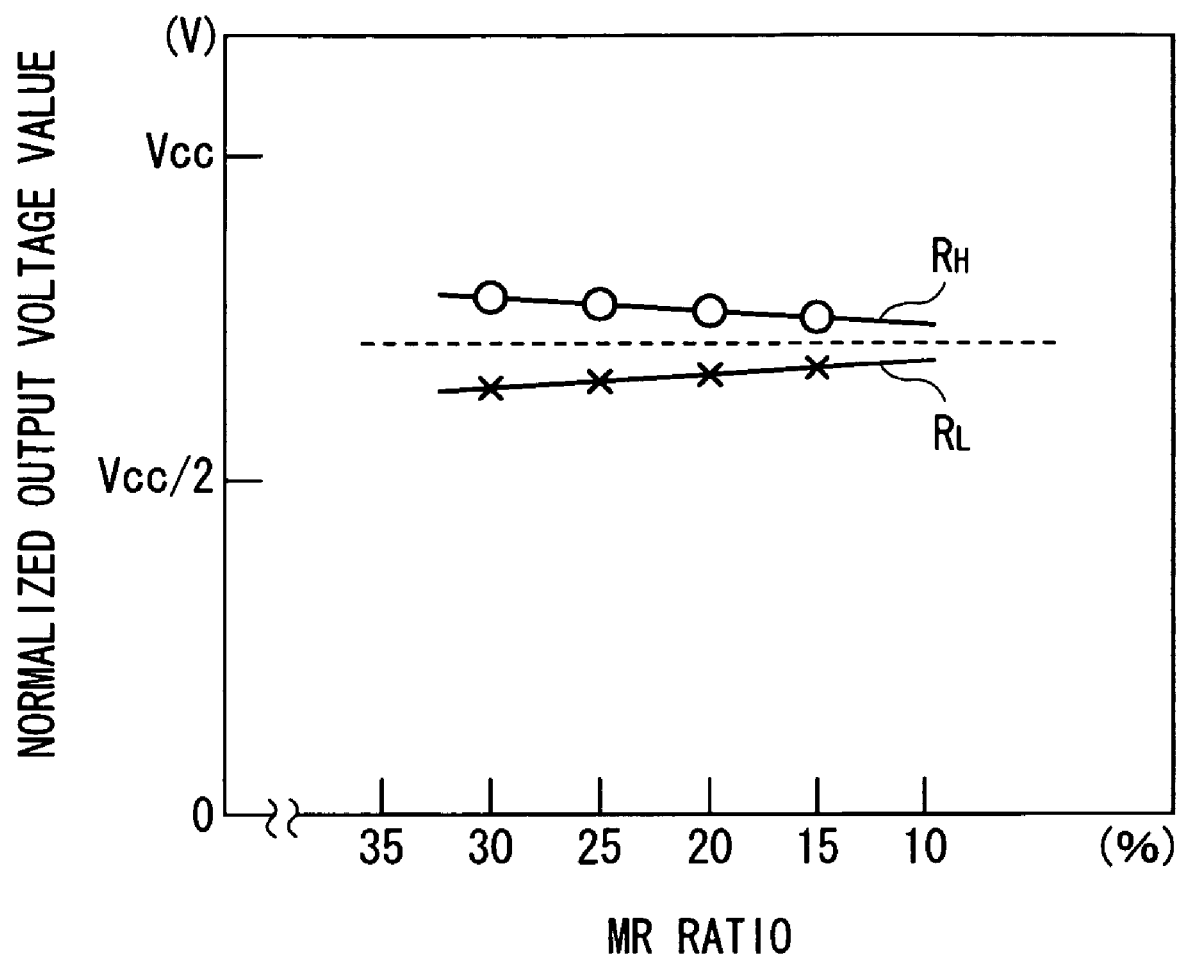
FIG. 24 is a diagram showing the relation between resistance fluctuations between magnetoresistive devices in a pair and an output voltage in the read circuit illustrated in FIG. 19.

FIG. 24 shows a measurement result. The horizontal axis denotes the MR ratio (%), and the vertical axis denotes an output voltage value (V) normalized with the power source voltage Vcc. In the diagram, each of blank circles indicates an output voltage value from the magnetoresistive device 12A (12B) having the resistance value $R_H$, and each of x marks indicates an output voltage value from the magnetoresistive device 12B (12A) having the resistance value $R_L$. Measurement values are connected by a solid line. Each of dotted lines indicates an offset reference value obtained by the constant current effect on voltages of the resistance values $R_H$ and $R_L$.

It is understood from the result shown in the diagram that, in the read circuit of the embodiment, the output voltage from the resistance value $R_L$ side and the output voltage from the resistance value $R_H$ side tend to gradually get close to each other as the MR ratio decreases. That is, when the MR ratio varies among the storage cells 12, the influence appears in such a form in the voltage output. Each of the output voltage on the resistance value $R_L$ side and that on the resistance value $R_H$ side lies within a predetermined range of a reference value. In this case, when the MR ratio is 15% or higher, the difference of the output voltages is sufficient as an output. Consequently, as compared with the case where the constant current circuit is not provided in the same circuit configuration, the possibility of occurrence of a read error is lower.

Generally in circuits having such a configuration, the sum of currents flowing in the magnetoresistive devices 12A and 12B is always the same, so that the currents have values always symmetrical in the vertical direction with respect to the value which is the half of the sum as a center in accordance with the ratio of device resistances. The offset reference value shown by the dotted line in FIG. 24 is a value obtained by converting the above-described value to a voltage and its position is non-changing as long as the sum of currents is not changed. By making the voltage level as a threshold of differential amplification of the sense amplifier 106B coincide with the offset reference value, a voltage output of a proper value is obtained from the sense amplifier 106B. This is also an effect of adding the constant current circuit.

Second Embodiment

A second embodiment of the present invention will now be described in detail with reference to FIGS. 25 to 32. The second embodiment has a characteristic different from that of the first embodiment in part of the configuration of the read circuit. In the following description, the same reference numerals are given to components which are substantially the same as those in the first embodiment and their description will not be repeated.

A magnetic memory device of the second embodiment has: the sense bit lines 21A and 21B as a read line pair extending in the bit line direction and supplying read current to the pair of magnetoresistive devices 12A and 12B; the sense word line 31 as an ground-side read line for leading the read current passed through the pair of magnetoresistive devices 12A and 12B to the ground; the constant current circuit 108B shared by the plurality of sense word lines 31 and specifying the sum of the pair of read currents flowing in the pair of magnetoresistive devices 12A and 12B in one storage cell 12; and the bit-direction unit readout circuit 80 as a read circuit for reading information from the storage cell 12 on the basis of the difference between the pair of read currents. The second embodiment will be more concretely described hereinbelow.

Figure 25:
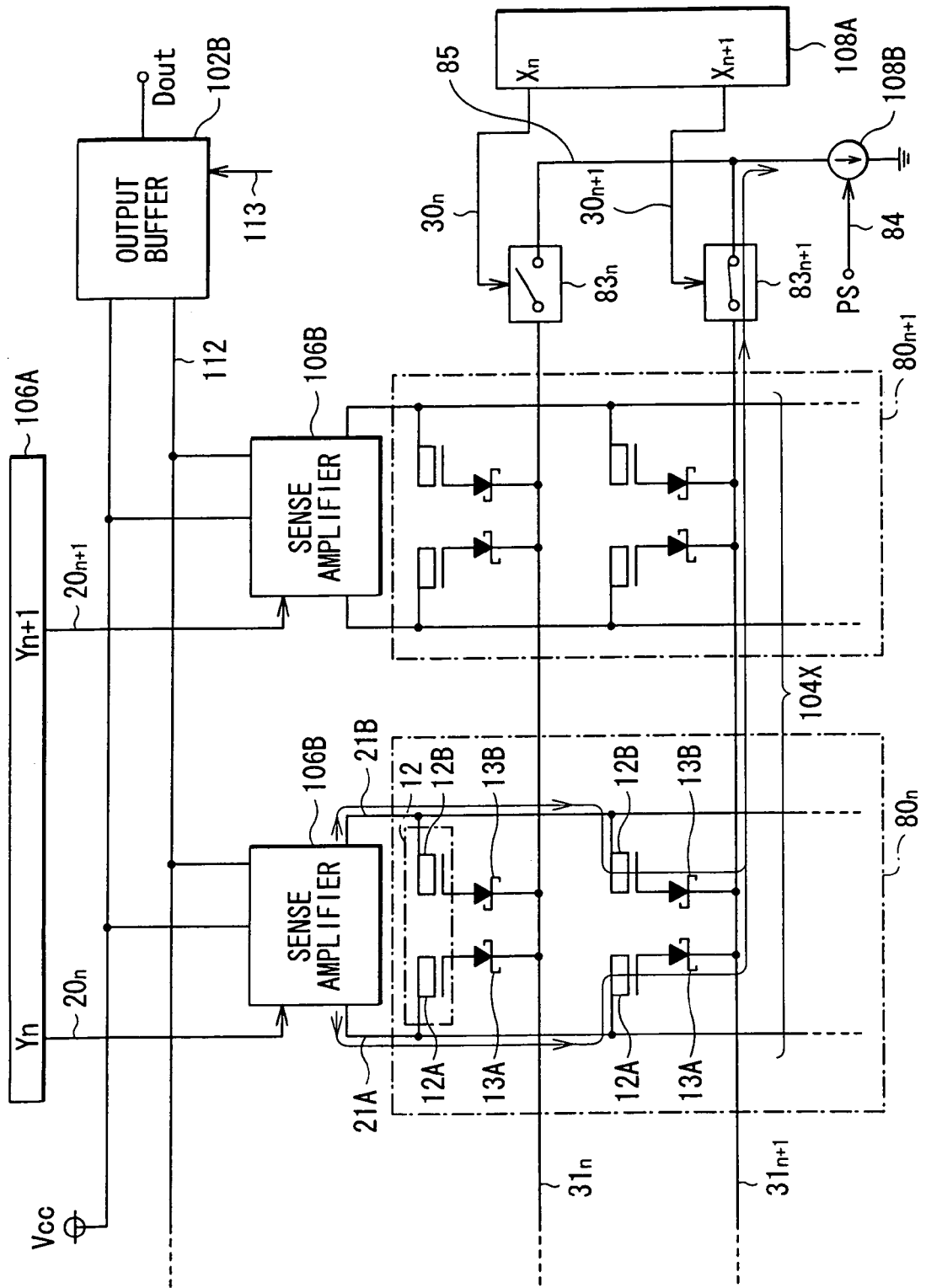
FIG. 25 is a diagram showing the configuration of a storage cell in a magnetic memory device according to a second embodiment of the invention and a read circuit.

FIG. 25 is a configuration diagram of a circuit system constructed by the storage cell group and a circuit for reading the storage cell group and is similar to the configuration diagram of FIG. 2. The read circuit system of FIG. 25 is a differential amplifier in which each of the storage cells 12 is constructed by a pair of magnetoresistive devices 12A and 12B in a manner similar to FIG. 2. Information in each of the storage cells 12 is read by outputting the difference value between sensing currents passed to the magnetoresistive devices 12A and 12B. In FIG. 25, the internal configuration of the sense amplifier 106B is not shown. The configurations of the transistors 22A and 22B and the resistors 23A and 23B are not shown because they are similar to the configurations in FIG. 2.

The configuration diagram of FIG. 25 has a characteristic part regarding connection in the word line direction. To each of the sense word lines 31, the magnetoresistive devices 12A and 12B arranged in the same word line $X_n$ ($X_1$, $X_2$, . . . ) are connected via the diodes 13A and 13B as rectifiers, respectively. In the second embodiment, the constant current circuit 108B is commonly provided on the ground side of the sense word lines 31. Each sense word line 31 has a read switch 83, and a selection signal is input from the X-direction address decoder 108A via the word decode line 30. To the constant current circuit 108B, a power save signal 84 is input from a power save (PS) terminal. In this case, the diodes 13A and 13B are constructed by Schottky diodes or PN junction diodes. The read switch 83 is provided between the constant current circuit 108B and the word decode line 30 and functions to select one of the plural storage cells 104X provided in the word line direction. The constant current circuit 108B has the function of making current flowing in the sense word line 31 constant and includes, as shown in FIG. 2, the diode 32 for generating constant voltage by using a bandgap reference, the transistor 33 for controlling current, and the current control resistor 34 which are not shown in FIG. 25. The read switch 83 is a concrete example of a "first semiconductor switch" in the present invention. The "storage cell group 104X" is a concrete example of a "second-direction storage cell group" in the present invention.

In the circuit configuration of the magnetic memory device shown in FIG. 25, in reading operation, sensing current flows in a path as described below.

In the case where the storage cell 12 in the $Y_n$ column and the $X_{n+1}$ row is selected as an object to be read, a selection signal is input to the $Y_n$-th bit decode line 20n and the $X_{n+1}$-th word decode line $30_{n+1}$. The selection signal input to the bit decode line 20n is input to the sense amplifier 106B. Therefore, when the voltage level in the $Y_n$-th bit decode line $20n$ is set to "high", the sensing current flows in the sense bit lines 21A and 21B in the bit-direction unit readout circuit $80_n$ from the power source Vcc side toward the opposite side. On the other hand, when the voltage level in the $X_{n+1}$-th word decode line $30_{n+1}$ is set to "high", the read switch $83_{n+1}$ in the $X_{n+1}$-th word line is made conductive. Therefore, the sensing current is permitted to flow in the storage cell 12 existing in the $Y_n$ column and the $X_{n+1}$ row. Concretely, the sensing current passes from the $Y_n$-th sense bit lines 21A and 21B, the magnetoresistive device 12A, the diode 13A, the magnetoresistive device 12B, and the diode 13B, also flows in the $X_{n+1}$-th sense word line $31_{n+1}$, passes through the read common line 85 via the read switch $83_{n+1}$ and, further, flows in the constant current circuit 108B.

Information is read, in a manner similar to the first embodiment, on the basis of the difference between a pair of current values supplied to the magnetoresistive devices 12A and 12B of the storage cell 12.

In the reading operation, the magnitude of the sensing current flowing in the selected storage cell 12 is controlled by the current control resistor 34 provided on the ground side of the sense word line 31. The current control resistor 34 produces an effect of regulating a current amount by itself. In the second embodiment, the constant current circuit 108B constructed by combining the current control resistor 34, transistor 33, and diode 32 operates to put a current amount within a predetermined range.

When the voltage level of the word decode line 30 is "high", the two diodes 32 connected in series fixedly generate an intermediate voltage level which is higher than the ground only by $+2\Phi$ by using the bandgap reference of the diodes. Therefore, the predetermined intermediate voltage level is applied to the base terminal of the transistor 33, the transistor 33 is energized, and sensing current of a fixed magnitude stably flows in the sense word line 31 by the function of the constant current circuit 108B.

The characteristic part of the second embodiment will be described in comparison with the first embodiment.

In the first embodiment, by providing each of the word lines with the constant current circuit 108B, variations in the resistance values caused by components of the storage cells 12 in the word lines are reduced, so that the read current normalized to a predetermined value can be always passed to the storage cells 12. In this case, however, due to variations in the characteristics of the components in the constant current circuits 108B, variations in the constant current circuits 108B cannot be perfectly removed.

In contrast, in the second embodiment, the constant current circuit 108B is commonly provided for the plurality of sense word lines 31 in the read circuit system to remove factors of the variations in the resistance values caused by the components and to always pass the read current normalizeddized to a predetermined value to the storage cells 12. In such a manner, variations in the resistance values caused by using the plural constant current circuits 108B can be prevented, and variations in the output current values of the sense amplifiers 106B can be further reduced. By commonly providing the constant current circuit 108B, the number of parts in the whole magnetic memory device can be reduced as compared with that in the case of providing the constant current circuit 108B for each of the word lines. Thus, the manufacturing cost can be reduced. Further, the number of constant current circuits 108B to which constant current has to be passed can be reduced, so that an effect of reducing power consumption in the whole magnetic memory device can be obtained.

The diodes 13A and 13B as rectifiers can be replaced with bipolar transistors or MOS transistors. In this case, the rectifiers also function as second semiconductor switches for selecting the storage cell group 104X arranged in the word line direction. A concrete example of this case will be described later.

By inputting the power save signal 84 to the constant current circuit 108B, the transistor 33 can be set in an energized state or an interrupted state. When reading of information is unnecessary, useless consumption current (standby current) can be reduced. Concretely, to start reading, the voltage level of the PS terminal is set to "high" and standby current is continuously passed from the constant current circuit 108B to the ground side to obtain a standby state so as to be always ready for read current. On the other hand, to finish reading, the voltage level of the PS terminal is set to "low" to check the flow of the standby current (base-emitter current), thereby obtaining a non-standby state. With such a configuration, although there is a possibility that response speed in the reading operation slightly decreases at the time of shift from the non-standby state to the standby state, the power consumption can be suppressed. Accordingly, the power consumption of the magnetic memory device as a whole can be reduced.

Some modifications of the magnetic memory device of the embodiment will be described hereinbelow.

Modification 2-1

Figure 26:
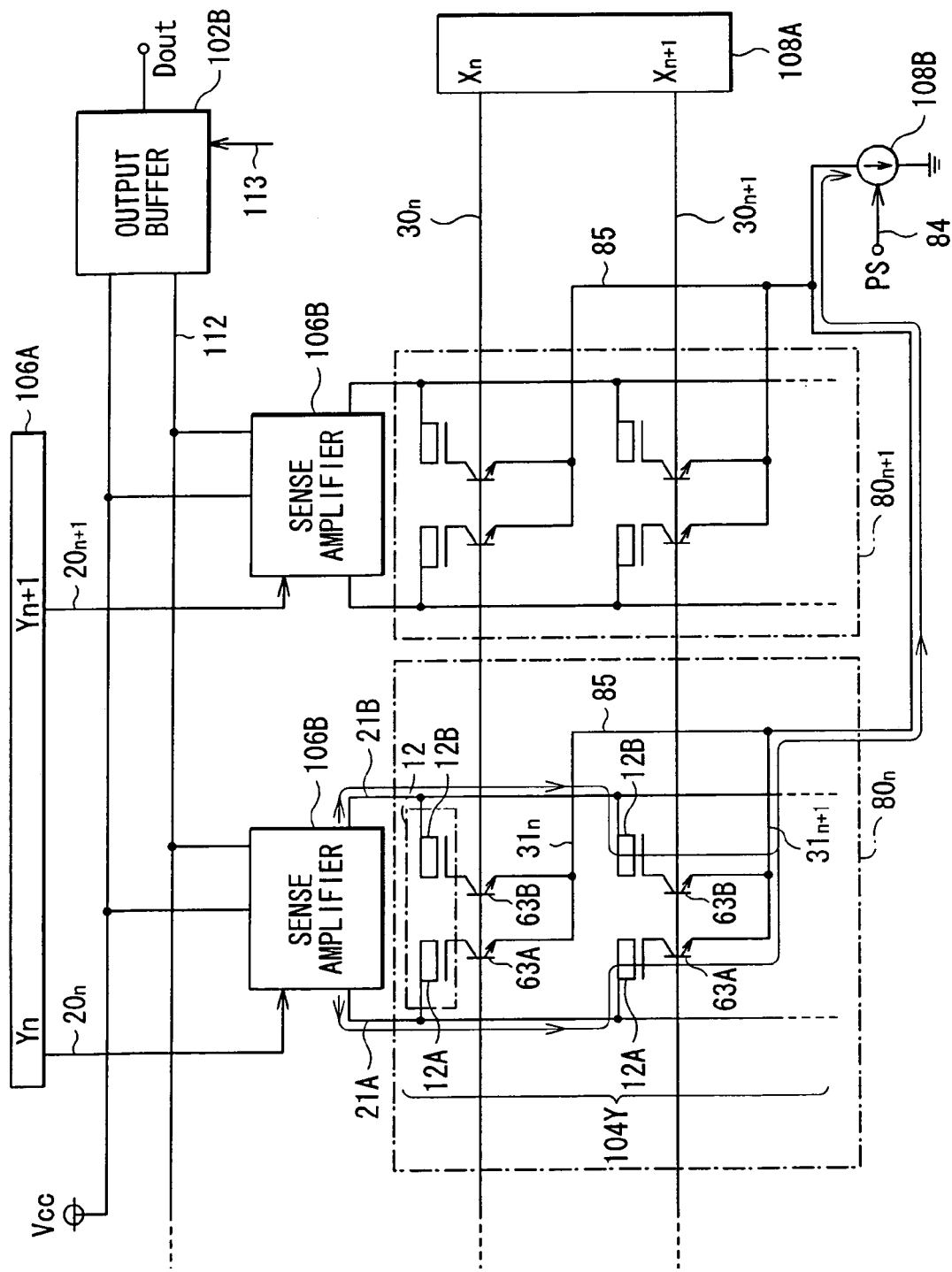
FIG. 26 is a configuration diagram illustrating a modification 2-1 in the read circuit shown in FIG. 25.

FIG. 26 shows a modification 2-1. In the modification, the diodes 13A and 13B shown in FIG. 25 are replaced with the bipolar transistors 63A and 63B. Further, in the modification, the bipolar transistors 63A and 64B function as a second semiconductor switch for selecting one of the plural storage cell groups 104X, and the read common line 85 for combining the plural sense word lines 31 of the storage cells 104Y to one is provided. The storage cell group 104Y is a concrete example of a "first-direction storage cell group" in the present invention.

In the circuit configuration of the magnetic memory device shown in FIG. 26, in reading operation, sensing current flows in a path described below.

In the case where the storage cell 12 in the $Y_n$ column and the $X_{n+1}$ row is selected as an object to be read, a selection signal is input to the $Y_n$-th bit decode line $20_n$ and the $X_{n+1}$-th word decode line $30_{n+1}$. The selection signal input to the bit decode line $20_n$ is input to the sense amplifier 106B. Therefore, when the voltage level in the $Y_n$-th bit decode line $20_n$ is set to "high", the sensing current flows in the sense bit lines 21A and 21B in the bit-direction unit readout circuit $80_n$ from the power source Vcc side toward the opposite side. On the other hand, when the voltage level in the $X_{n+1}$-th word decode line $30_{n+1}$ is set to "high", the pair of bipolar transistors 63A and 63B in the $X_{n+1}$-th word line is made conductive. Therefore, the sensing current is permitted to flow in the storage cell 12 existing in the $Y_n$ column and the $X_{n+1}$ row. Concretely, the sensing current passes from the $Y_n$-th sense bit lines 21A and 21B, the magnetoresistive device 12A, the bipolar transistor 63A, the magnetoresistive device 12B, and the bipolar transistor 63B, also flows in the $X_{n+1}$-th sense word line $31_{n+1}$, passes through the selection switch $86_n$ via the read common line 85 and, further, flows in the constant current circuit 108B.

Information is read, in a manner similar to the first embodiment, on the basis of the difference between a pair of current values supplied to the magnetoresistive devices 12A and 12B of the storage cell 12.

Also in the modification 2-1 shown in FIG. 26, effects similar to those of the magnetic memory device having the circuit configuration shown in FIG. 25 are obtained.

Modification 2-2

Figure 27:
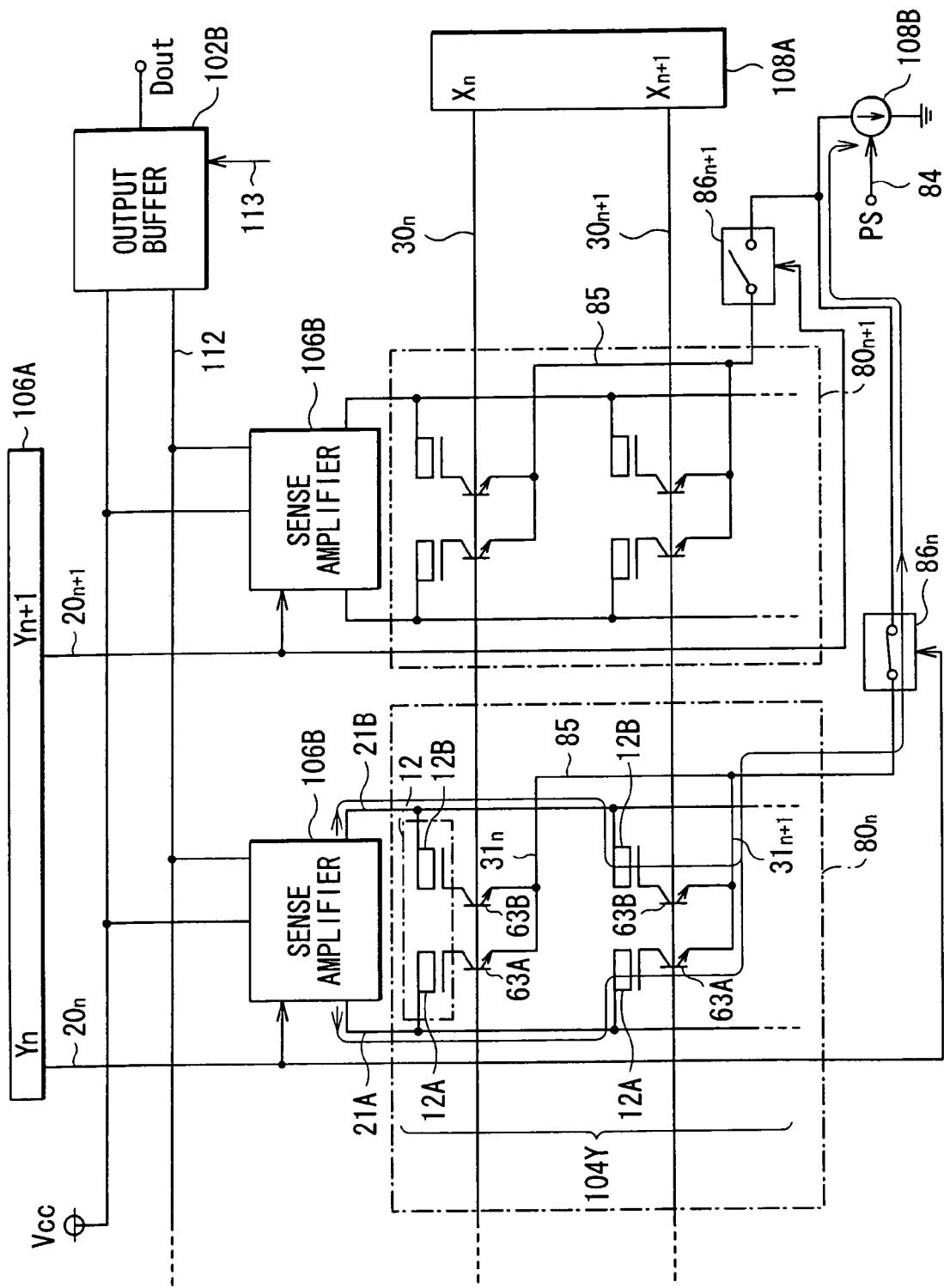
FIG. 27 is a configuration diagram illustrating a modification 2-2 in the read circuit shown in FIG. 25.

A memory device of modification 2-2 shown in FIG. 27 has, in addition to the configuration of the modification 2-1 shown in FIG. 26, a selection switch 86 provided between each of the plural read common lines 85 and the constant current circuit 108B and selecting one of plural storage cell groups 104Y. The selection switch 86 is controlled to switch on/off by a selection signal for selecting one of the plural storage cell groups 104Y to which read current is passed. In such a case, in the reading operation, sensing current flows in the following route.

In the case where the storage cell 12 in the $Y_n$ column and the $X_{n+1}$ row is selected as an object to be read, a selection signal is input to the $Y_n$-th bit decode line $20_n$ and the $X_{n+1}$-th word decode line $30_{n+1}$. The selection signal input to the bit decode line $20_n$ is input to the sense amplifier 106B and the selection switch 86. Therefore, when the voltage level in the $Y_n$-th bit decode line $20_n$ is set to "high", the sensing current flows in the sense bit lines 21A and 21B in the bit-direction unit readout circuit $80_n$ from the power source Vcc side toward the opposite side. Simultaneously, the selection switch 86 enters an energizable state. On the other hand, when the voltage level in the $X_{n+1}$-th word decode line $30_{n+1}$ is set to "high", the pair of bipolar transistors 63A and 63B in the $X_{n+1}$-th word line is made conductive. Therefore, the sensing current is permitted to flow in the storage cell 12 existing in the $Y_n$ column and the $X_{n+1}$ row. Concretely, the sensing current passes from the $Y_n$-th sense bit lines 21A and 21B, the magnetoresistive device 12A, the bipolar transistor 63A, the magnetoresistive device 12B, and the bipolar transistor 63B, also flows in the $X_{n+1}$-th sense word line $31_{n+1}$, passes through the selection switch $86_n$ via the read common line 85 and, further, flows in the constant current circuit 108B.

Information is read, in a manner similar to the first embodiment, on the basis of the difference between a pair of current values supplied to the magnetoresistive devices 12A and 12B of the storage cell 12.

In such a configuration, leak current in another storage cell group 104Y which is not to be read can be removed more reliably. Specifically, in the read circuit configuration shown in FIGS. 25 and 26, the storage cells 12 in the storage cell group 104Y are connected to each other via the sense word line 31 or read common line 85. Since the sense amplifier 106B provided for each bit line has a potential slightly higher than the potential of the ground level, even in the case where the bit line is not selected (the bit line does not include the storage cell 12 to be read), weak current continues flowing in the sense bit lines 21A and 21B. Further, in the read circuit configuration shown in FIG. 26, when a selection signal of the "high" level is input to the word decode line 30, there is a possibility that forward current flows between the base and emitter of each of the pair of bipolar transistors 63A and 63B in the bit line. In contract, in the circuit configuration of FIG. 27, the read common line 85 is provided for the storage cell group 104Y in the bit line direction as an object to be read to combine the sense word lines 31 in the storage cell group 104Y into one, and a selection switch $86_n$ is provided for each storage cell group 104Y. With the configuration, the selection switch 86 provided for the not-selected storage cell group 104Y is interrupted, so that weak current and unnecessary forward current do not flow in the sense bit lines 21A and 21B. Therefore, the power consumption can be reduced more in the whole magnetic memory device.

Modification 2-3

Figure 28:
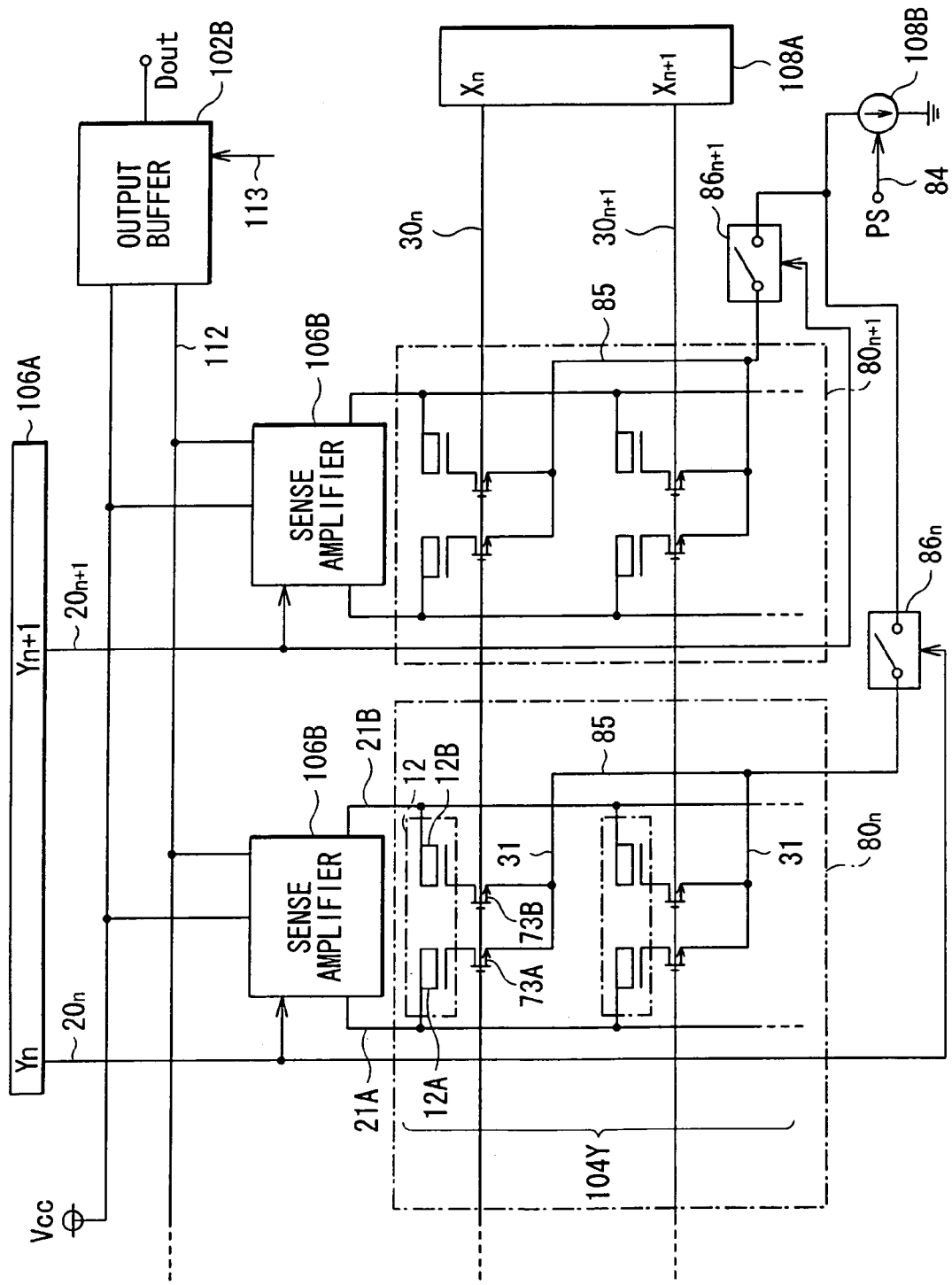
FIG. 28 is a configuration diagram illustrating a modification 2-3 in the read circuit shown in FIG. 25.

As shown in FIG. 28, the bipolar transistors 63A and 63B shown in FIG. 27 can be also replaced with the MOS transistors 73A and 73B. In this case, the sensing currents from the magnetoresistive devices 12A and 12B in each storage cell 12 flow in the drains in the MOS transistors 73A and 73B, respectively, and are combined via the sources. The resultant is led to the read common line 85 provided for each storage cell group 104Y. The gates in the MOS transistors 73A and 73B are opened/closed by a selection signal from the word decode line 30.

Figure 29:
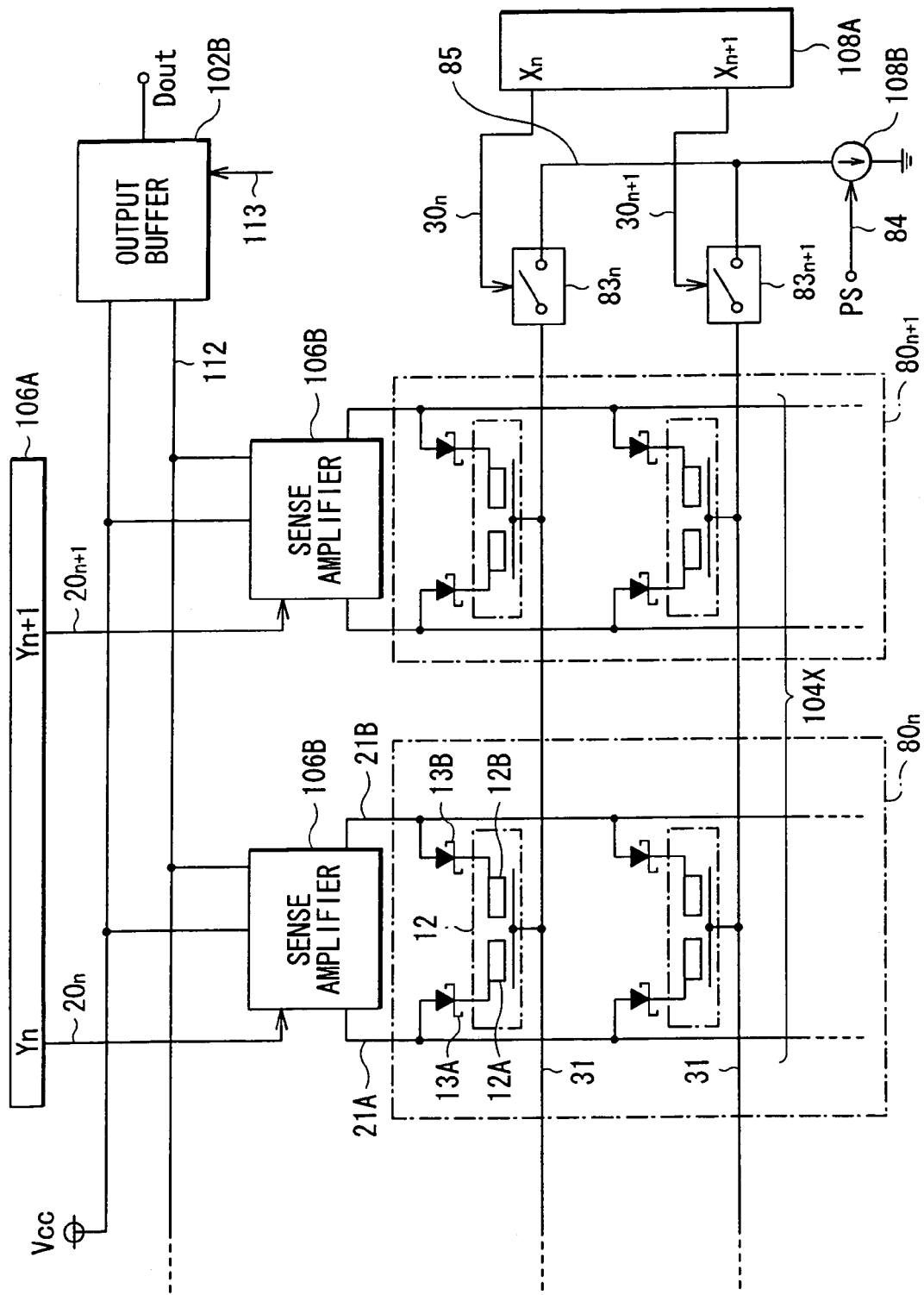
FIG. 29 is a configuration diagram illustrating a modification 2-4 in the read circuit shown in FIG. 25.
Figure 31:
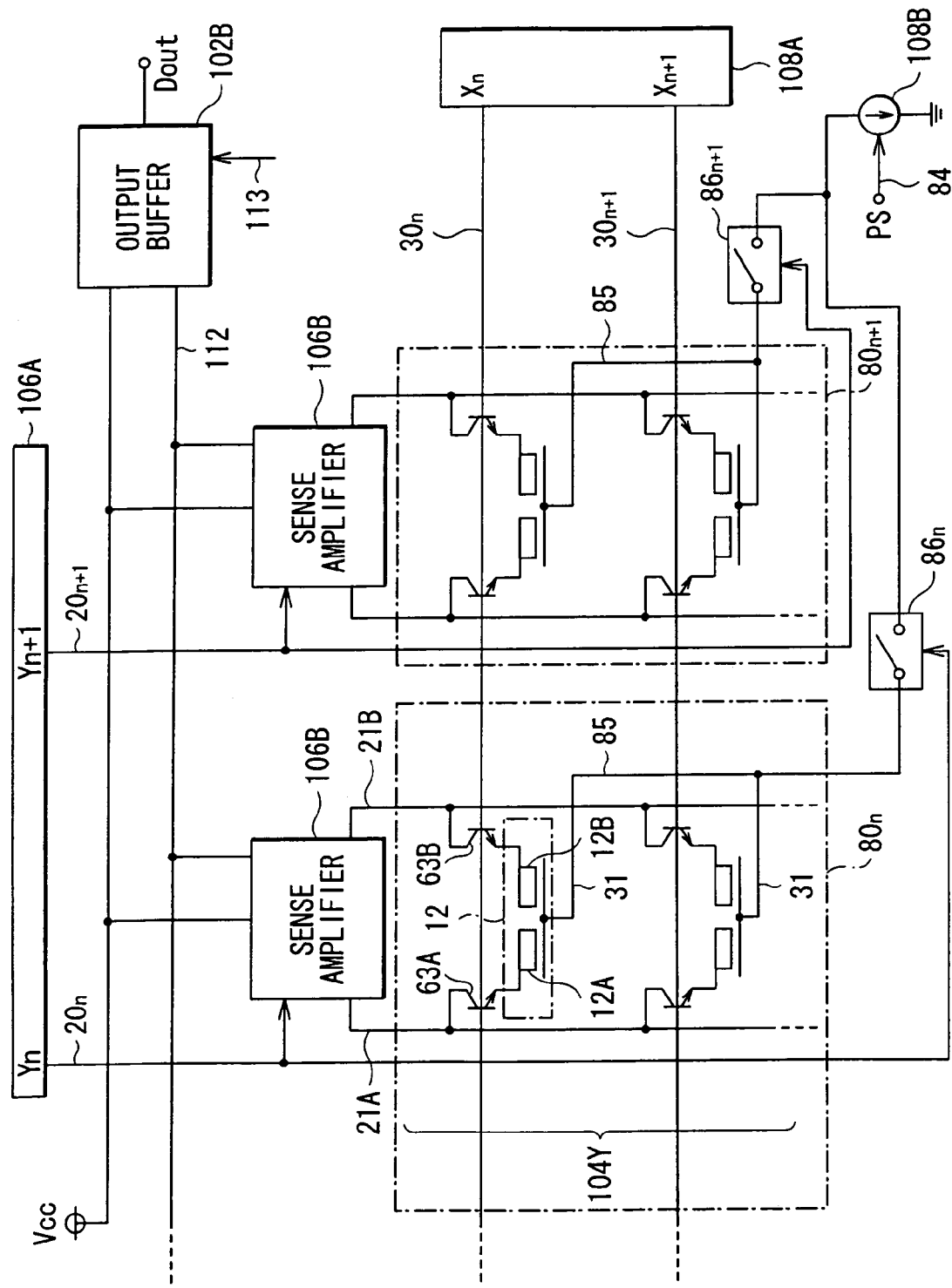
FIG. 31 is a configuration diagram illustrating a modification 2-5 in the read circuit shown in FIG. 25.
Figure 32:
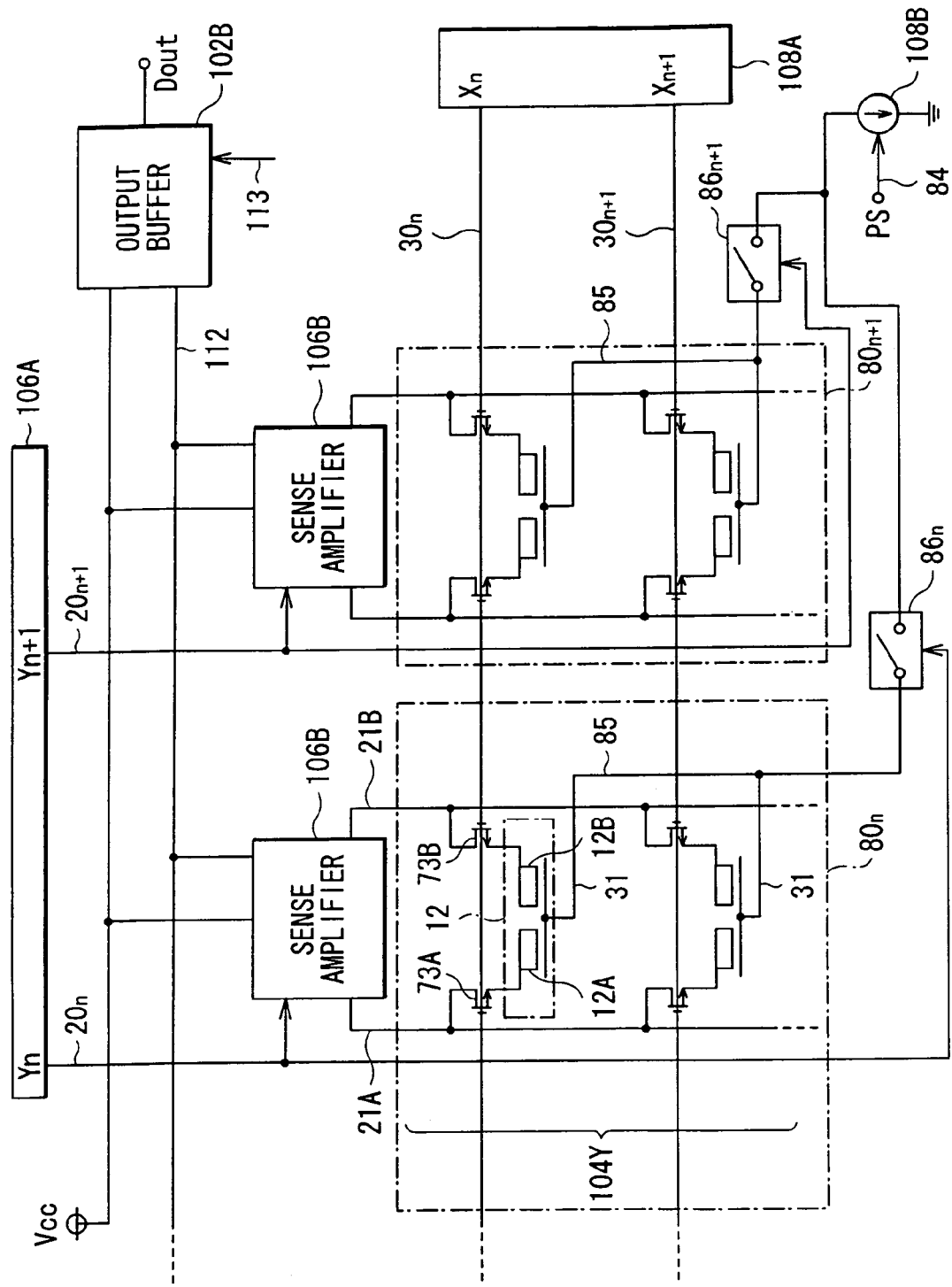
FIG. 32 is a configuration diagram illustrating a modification 2-6 in the read circuit shown in FIG. 25.

Further, a pair of rectifiers provided for preventing backflow may be provided between the sense bit lines 21A and 21B and the magnetoresistive devices 12A and 12B as shown in FIGS. 29, 31, and 32.

Modification 2-4

Figure 30:
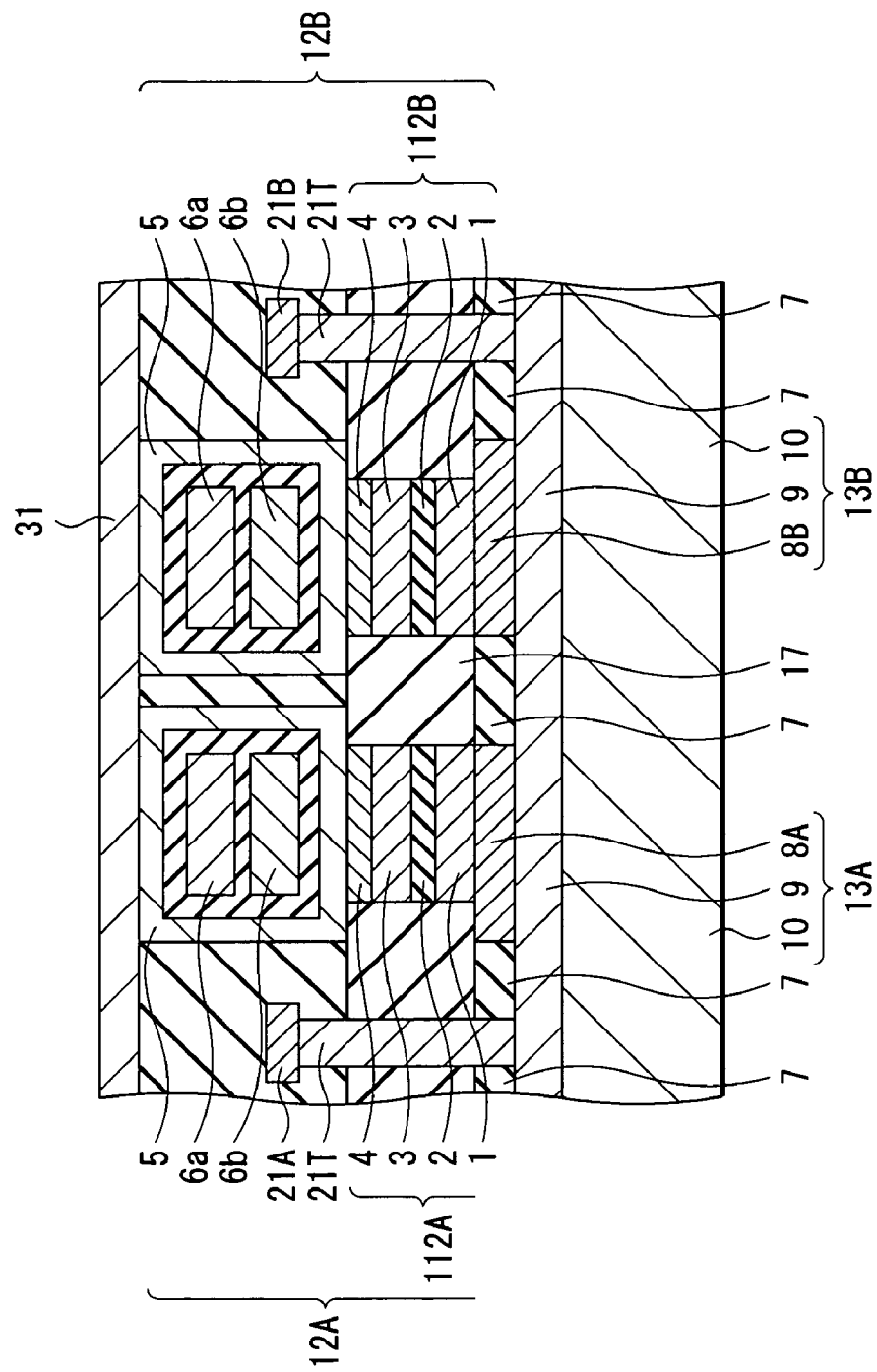
FIG. 30 is a partial cross section showing a sectional configuration of a portion around a storage cell corresponding to the read circuit illustrated in FIG. 29.

FIG. 29 corresponds to FIG. 25. In FIG. 29, the pair of diodes 13A and 13B is provided between the sense bit lines 21A and 21B and the magnetoresistive devices 12A and 12B, respectively. FIG. 30 shows a sectional configuration of/around the pair of magnetoresistive devices 12A and 12B in such a circuit configuration. FIG. 30 is similar to FIG. 7 referred to in the first embodiment. In FIG. 30, TMR films 112A and 112B and the toroidal magnetic layer 5 constructed so as to be penetrated by the write bit line 6a and the write word line 6b are formed in order from the side of the diodes 13A and 13B. The sense bit lines 21A and 21B are connected to the epitaxial layer 9 via a connection layer 21T, and read current is passed perpendicularly in the TMR films 112A and 112B via the conductive layers 8A and 8B, respectively. The read current passed through the TMR films 112A and 112B flow in the sense word line 31 via the toroidal magnetic layer 5.

Modifications 2-5 and 2-6

FIG. 31 corresponds to FIG. 27. In FIG. 31, the pair of bipolar transistors 63A and 63B is provided between the sense bit lines 21A and 21B and the magnetoresistive devices 12A and 12B, respectively (modification 2-5). FIG. 32 corresponds to FIG. 28. In FIG. 32, the pair of MOS transistors 73A and 73B is provided between the sense bit lines 21A and 21B and the magnetoresistive devices 12A and 12B, respectively (modification 2-6). Each of the modification 2-5 shown in FIG. 31 and the modification 2-6 shown in FIG. 32 can be also constructed without using the selection switch 86. In this case as well, an effect of providing the constant current circuit 106B so as to be shared by the sense word lines 31 can be obtained.

Although the present invention has been described by the embodiments and some modifications, the invention is not limited to them but can be variously modified. For example, although the bipolar transistors are used as the switching devices of the sense amplifier 106B, constant current circuit 108B, and transistors 22A and 22B in the foregoing embodiments, the invention is not limited to the bipolar transistors. Alternately, semiconductor devices such as CMOS (Complementary MOS) may be used.

As the magnetic memory device of the invention, any magnetic memory device can be used as long as it stores one-unit information by using two magnetoresistive devices each having the toroidal magnetic layer, and its writing/reading method is not limited to that of the foregoing embodiments. For example, it is also possible to store the same information in two magnetoresistive devices, read the information from one of the devices in a normal state and, when a read error occurs, read the information from the other device. Since two devices can be used for one-unit information, as compared with the case where one-unit information corresponds to one device, the flexibility in applicable writing and reading methods is higher.

The foregoing embodiments have been described on assumption that the storage cell 12 is constructed by the TMR devices as the magnetoresistive devices each including the stacked body in which current flows perpendicular to the stack face. The TMR devices may be replaced with CPP-GMR devices.

The constant current circuit of the invention can be widely applied to magnetic memory devices performing so-called differential reading, in which the structure of a pair of magnetoresistive devices constructing a storage cell is not particularly limited. Specifically, the pair of the magnetoresistive devices does not have the same configuration as that of the storage cell 12 described in the foregoing embodiments but may have a configuration such that, for example, a read sensing conductor is connected to a stacked body including the first magnetic layer 1, the nonmagnetic layer 2, and the second magnetic layer 3 as a magneto-sensitive layer but not having the toroidal magnetic layer 5, and information is read by passing current perpendicular to the stack face. Alternately, the pair of magnetoresistive devices may be magnetoresistive devices (CIP (Current flows In the Plane)-GMR) including a stacked body in which current flows in the direction parallel with the stack face. With respect to the wiring structure, the invention is not limited to the write and read lines except that plural storage cells are connected to a one-way read line (ground-side read line). In such a case as well, the constant current circuit of the invention can display actions and effects similar to those of the embodiments.

In the embodiments, the sense bit lines 21A and 21B correspond to a read line pair, and the sense word line 31 corresponds to the ground-side read line. The wiring directions of the first and ground-side read lines are not limited to those in the foregoing embodiments but may have a corresponding relation opposite to the above relation.

As described above, the magnetic memory device of the invention including plural magnetoresistive devices each having a magneto-sensitive layer whose magnetization direction changes according to an external magnetic field and constructed so that each of storage cells includes a pair of magnetoresistive devices, has: a read line pair provided so as to extend in a first direction and supplying a read current to the pair of magnetoresistive devices; a ground-side read line for guiding the read current passed through the pair of magnetoresistive devices to the ground; a constant current circuit commonly provided for plural ground-side read lines and making the sum of a pair of read currents passing through the pair of magnetoresistive devices in one storage cell constant; and a read circuit for reading information from the storage cell on the basis of the difference between the pair of read currents. Thus, variations in the resistance value caused by using plural constant current circuits can be removed, and variations in the read current values can be reduced. By providing the constant current circuit so as to be shared, the relative number of parts in the whole magnetic memory device can be reduced more than the case of providing the constant current circuit for each of ground-side read lines. Thus, the manufacture cost can be reduced. Further, the number of constant current circuits to which constant current has to be always passed can be reduced, so that power consumption in the whole magnetic memory device can be also reduced.

The magnetic memory device may further include: a read common line provided for each of the plural first-direction storage cell groups arranged in the first direction and combining plural ground-side read lines for each first-direction storage cell group to one line; and a selection switch provided between each of the plural read common lines and the constant current circuit and selecting one of the plural first-direction storage cell groups. The selection switch is controlled to be open/close by a selection signal for selecting one of the plural first-direction storage cell groups to which read current is passed. With the configuration, leak current in the first-direction storage cell group which is not selected can be removed more reliably. As a result, power consumption can be reduced.

Further, the magnetic memory device may further includes: plural first write lines; and plural second write lines extending so as to cross the plural first write lines, and each of the pair of magnetoresistive devices includes: a stacked body including a magneto-sensitive layer whose magnetization direction changes according to an external magnetic field and constructed so that current flows in a direction perpendicular to a stack face; and a toroidal magnetic layer provided so that its axial direction is a direction along the stack face on the side of one of faces of the stacked body and constructed so as to be penetrated by the first and second write lines. In this case, at the time of writing, the magnetization of the magneto-sensitive layer can be reverse efficiently by the action of the toroidal magnetic layer. Moreover, one-unit information is stored by using two magnetoresistive devices, so that information can be efficiently written with reliability. Simultaneously, flexibility can be given to the information writing and reading methods.

The invention also provides a method of reading a magnetic memory device including plural magnetoresistive devices each having a magneto-sensitive layer whose magnetization direction changes according to an external magnetic field and constructed so that each of storage cells includes a pair of magnetoresistive devices, comprising the steps of: supplying a read current to the pair of magnetoresistive devices via a read line pair provided so as to extend in a first direction in each of the pairs of magnetoresistive devices; guiding the read current passed through the pair of magnetoresistive devices to the ground via a ground-side read line; and making the sum of a pair of read currents passing through the pair of magnetoresistive devices in one storage cell constant by a constant current circuit commonly provided for plural ground-side read lines; and reading information from the storage cell on the basis of the difference between the pair of read currents. Thus, variations in the resistance values caused by using the plural constant current circuits can be removed, and read currents with smaller variations can be obtained. Further, the number of constant current circuits to which constant current has to be always passed can be reduced, so that the power consumption of the whole magnetic memory device at the time of reading can be also reduced.

The invention claimed is:

1. A magnetic memory device including plural magnetoresistive devices each having a magneto-sensitive layer whose magnetization direction changes according to an external magnetic field and constructed so that each of storage cells includes a pair of magnetoresistive devices, comprising:

a read line pair provided so as to extend in a first direction in each of the pairs of magnetoresistive devices and supplying a read current to the pair of magnetoresistive devices;

a ground-side read line for guiding the read current passed through the pair of magnetoresistive devices to the ground;

a constant current circuit commonly provided for plural ground-side read lines and making the sum of a pair of read currents passing through the pair of magnetoresistive devices in one storage cell constant; and a read circuit for reading information from the storage cell on the basis of the difference between the pair of read currents.

2. A magnetic memory device according to claim 1, wherein the constant current circuit is disposed between the pair of magnetoresistive devices and the ground.

3. A magnetic memory device according to claim 1, wherein the constant current circuit is constructed by using a bandgap reference.

4. A magnetic memory device according to claim 3, wherein the constant current circuit comprises:

a current control transistor;

a diode connected between a base of the current control transistor and the ground; and a current control resistor connected between the emitter of the current control transistor and the ground.

5. A magnetic memory device according to claim 1, further comprising a pair of rectifiers provided on a current path of the read current supplied to the pair of magnetoresistive devices.

6. A magnetic memory device according to claim 5, wherein the pair of rectifiers is provided between the pair of magnetoresistive devices and the ground-side read line.

7. A magnetic memory device according to claim 5, wherein the pair of rectifiers is provided between the read line pair and the pair of magnetoresistive devices.

8. A magnetic memory device according to claim 5, wherein the rectifier is a Schottky diode or a PN junction diode, and a first semiconductor switch for selecting one of plural second-direction storage cell groups arranged in a second direction orthogonal to the first direction is provided between the constant current circuit and each of the plural ground-side read lines.

9. A magnetic memory device according to claim 5, wherein the rectifier also functions as a second semiconductor switch for selecting one of plural second-direction storage cell groups arranged in a second direction orthogonal to the first direction.

10. A magnetic memory device according to claim 9, further comprising:

a read common line provided for each of the plural first-direction storage cell groups arranged in the first direction and combining plural ground-side read lines for each first-direction storage cell group to one line; and a selection switch provided between each of the plural read common lines and the constant current circuit and selecting one of the plural first-direction storage cell groups.

11. A magnetic memory device according to claim 10, wherein the selection switch is controlled to be open/close by a selection signal for selecting one of the plural first-direction storage cell groups to which read current is passed.

12. A magnetic memory device according to claim 9, wherein the second semiconductor switch is a bipolar transistor or a MOS transistor.

13. A magnetic memory device according to claim 1, further comprising:

plural first write lines; and plural second write lines extending so as to cross the plural first write lines, wherein each of the pair of magnetoresistive devices includes:

a stacked body including a magneto-sensitive layer whose magnetization direction changes according to an external magnetic field and constructed so that current flows in a direction perpendicular to a stack face; and a toroidal magnetic layer provided so that its axial direction is a direction along the stack face on the side of one of faces of the stacked body and constructed so as to be penetrated by the first and second write lines.

14. A magnetic memory device according to claim 13, wherein magnetization directions of the magneto-sensitive layers in the pair of magnetoresistive devices change so as to be anti-parallel with each other by a magnetic field generated by currents flowing in the first and second write lines penetrating the toroidal magnetic layer, thereby storing information in the storage cell.

15. A magnetic memory device according to claim 14, wherein information is stored in the storage cell in accordance with:

a first state in which one of the pair of magneto-sensitive layers in the pair of magnetoresistive devices is magnetized in a first magnetization direction and the other magneto-sensitive layer is magnetized in a second magnetization direction anti-parallel with the first magnetization direction; or a second state in which one of the pair of magneto-sensitive layers is magnetized in the second magnetization direction and the other magneto-sensitive layer is magnetized in the first magnetization direction.

16. A method of reading a magnetic memory device including plural magnetoresistive devices each having a magneto-sensitive layer whose magnetization direction changes according to an external magnetic field and constructed so that each of storage cells includes a pair of magnetoresistive devices, comprising the steps of:

supplying a read current to the pair of magnetoresistive devices via a read line pair provided so as to extend in a first direction in each of the pairs of magnetoresistive devices;

guiding the read current passed through the pair of magnetoresistive devices to the ground via a ground-side read line;

making the sum of a pair of read currents passing through the pair of magnetoresistive devices in one storage cell constant by a constant current circuit commonly provided for plural ground-side read lines; and reading information from the storage cell on the basis of the difference between the pair of read currents.

* * * * *